United States Patent
Chua-Eoan et al.

(10) Patent No.: US 9,508,607 B2
(45) Date of Patent: Nov. 29, 2016

(54) THERMAL MANAGEMENT OF TIGHTLY INTEGRATED SEMICONDUCTOR DEVICE, SYSTEM AND/OR PACKAGE

(71) Applicant: QUALCOMM Incorporated

(72) Inventors: Lew G. Chua-Eoan, Carlsbad, CA (US); Rongtian Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 767 days.

(21) Appl. No.: 13/741,755

(22) Filed: Jan. 15, 2013

(65) Prior Publication Data

US 2014/0022002 A1    Jan. 23, 2014

Related U.S. Application Data

(60) Provisional application No. 61/673,803, filed on Jul. 20, 2012.

(51) Int. Cl.
| | |
|---|---|
| *G06F 17/50* | (2006.01) |
| *H01L 21/66* | (2006.01) |
| *H01L 35/00* | (2006.01) |
| *G07F 17/32* | (2006.01) |
| *G06F 1/20* | (2006.01) |
| *H01L 23/34* | (2006.01) |
| *H01L 25/065* | (2006.01) |

(Continued)

(52) U.S. Cl.
CPC .............. *H01L 22/10* (2013.01); *G06F 1/206* (2013.01); *G06F 1/324* (2013.01); *G06F 1/3253* (2013.01); *G06F 1/3275* (2013.01); *G06F 1/3287* (2013.01); *G07F 17/326* (2013.01); *H01L 22/00* (2013.01); *H01L 23/34* (2013.01); *H01L 25/0657* (2013.01); *H01L 25/18* (2013.01); *H01L 35/00* (2013.01); *H01L 2224/16145* (2013.01); *H01L 2224/16225* (2013.01); *H01L 2225/06513* (2013.01); *H01L 2225/06517* (2013.01); *H01L 2225/06589* (2013.01); *Y02B 60/1217* (2013.01); *Y02B 60/1228* (2013.01); *Y02B 60/1235* (2013.01); *Y02B 60/1282* (2013.01)

(58) Field of Classification Search
CPC ........................................................ G06F 17/50
USPC ........................................................ 716/132
See application file for complete search history.

(56) References Cited

U.S. PATENT DOCUMENTS

| | | |
|---|---|---|
| 6,809,538 B1 | 10/2004 | Borkar |
| 7,852,138 B2 | 12/2010 | Kuusilinna et al. |
| 2006/0052970 A1 | 3/2006 | Arabi et al. |

(Continued)

OTHER PUBLICATIONS

Ituero P. et al., "Leakage-based On-Chi Thermal Sensor for CMOS Technology" IEEE, May 27, 2007, pp. 3327-3330, XP031182017.

(Continued)

*Primary Examiner* — Thuan Do
(74) *Attorney, Agent, or Firm* — Michelle S. Gallardo

(57) ABSTRACT

Some implementations provide a package that includes a first die and a second die adjacent to the first die. The second die is capable of heating the first die. The package also includes a leakage sensor configured to measure a leakage current of the first die. The package also includes a thermal management unit coupled to the leakage sensor. The thermal management unit configured to control a temperature of the first die based on the leakage current of the first die.

51 Claims, 13 Drawing Sheets

(51) Int. Cl.
*G06F 1/32* (2006.01)
*H01L 25/18* (2006.01)

(56) References Cited

U.S. PATENT DOCUMENTS

| | | | | |
|---|---|---|---|---|
| 2009/0107988 A1* | 4/2009 | Kaastra | ............ | C03C 8/10 219/553 |
| 2010/0117579 A1 | 5/2010 | Culbert et al. | | |
| 2011/0060932 A1 | 3/2011 | Conroy et al. | | |
| 2011/0291269 A1 | 12/2011 | Griebenow et al. | | |
| 2012/0061059 A1 | 3/2012 | Hsiao et al. | | |
| 2013/0257177 A1* | 10/2013 | Jacobson | ............ | H02M 1/08 307/115 |
| 2013/0298101 A1* | 11/2013 | Chandra | ............ | G06F 17/50 716/136 |

OTHER PUBLICATIONS

Coskun A.K., et al., "Dynamic thermal management in 3D multicore architectures", Design, Automation & Test in Europe Conference & Exhibition, 2009, Date '09, IEEE, Piscataway, NJ, USA, Apr. 20, 2009, pp. 1410-1415, XP032317705, DOI: 10.1109/DATE.2009.5090885 ISBN: 978-1-4244-3781-8 abstract; figure 1 p. 1410, col. 2, line 4-line 52 p. 1411, col. 2, line 14—p. 1412, col. 1, line 43 p. 1412, col. 2, line 26—p. 1413, col. 1, line 15.

International Search Report and Written Opinion—PCT/US2013/051392—ISA/EPO—Feb. 24, 2014.
Miettinen J., et al., "System design issues for 3D system-in-package (SiP)", Electronic Components and Technology, 2004, ECTC '04, Proceedings Las Vegas, NV, USA Jun. 1-4, 2004, Piscataway, NJ, USA, IEEE, vol. 1, Jun. 1, 2004, pp. 610-615, XP010714627, DOI: 10.1109/ECTC.2004.1319401 ISBN: 978-0-7803-8365-4 abstract; figures la, lb, 2 p. 610, col. 2, line 19-line 23 p. 611, col. 2, line 32-line 47.
Zhou X., et al., "Thermal Management for 3D Processors via Task Scheduling", Parallel Processing, 2008, ICPP '08, 37th International Conference on, IEEE, Piscataway, NJ, USA, Sep. 9, 2008, pp. 115-122, XP031321541, ISBN: 978-0-7695-3374-2 abstract; figures 1, 2, 5 p. 118, col. 2, line 40—p. 120, col. 1, line 17.
Zhu C., et al., "Three-Dimensional Chip-Multiprocessor Run-Time Thermal Management," IEEE Transactions on Computer Aided Design of Integrated Circuits and Systems, Aug. 2008, vol. 27 (8), pp. 1479-1492.
Chao C.H., et al., "Traffic and Thermal-Aware Run-Time Thermal Management Scheme for 3D NoC Systems", Networks-On-Chip (NOCS), 2010 Fourth ACM/IEEE International Symposium on, IEEE, Piscataway, NJ, USA, May 3, 2010, pp. 223-230, XP031707246, ISBN: 978-1-4244-7085-3 abstract; figures 1,2,8,9,10 p. 223, col. 2, line 15-line 33 p. 224, col. 1, line 27-line 54 line 17-line 30 line 1—p. 227, p. 224, col. 2, p. 226, col. 2, col. 1, line 27.

* cited by examiner

THERMAL MANAGEMENT OF TIGHTLY INTEGRATED SEMICONDUCTOR DEVICE, SYSTEM AND/OR PACKAGE

CLAIM OF PRIORITY UNDER 35 U.S.C. §119

The present application claims the benefit of U.S. Provisional Application No. 61/673,803 entitled "Thermal Management of Tightly Integrated System", filed Jul. 20, 2012, which is hereby expressly incorporated by reference herein.

BACKGROUND

Field

Various features relate to the thermal management of a tightly integrated semiconductor device, system, and/or package.

Background

FIG. 1 illustrates an example of a tightly integrated semiconductor device 100 (also be referred to as a system and/or package) found, in the prior art. Examples of tightly integrated semiconductor devices include System in Package (SiP) and System on Glass (SoG). As shown in FIG. 1, the semiconductor device 100 includes a packaging substrate 102 and several dice 104-108. The first die is a processor 104, the second die is a first memory 106 and. the third die is a second memory 108. The processor 104, the first memory 106 and the second memory 108 are stacked on top of each other. Specifically, the processor 104 is on top of the packaging substrate 102 and is electrically coupled to the packaging substrate 102. The first memory 106 is on top of the processor 104 and the second memory 108 is on top of the first memory 106. Each of the memories 106 and 108 are electrically coupled to the packaging substrate 102, Typically, the processor 104, the first memory 106 and the second memory 108 communicate with each other through electrical connections in the packaging substrate 102. The packaging substrate 102 can be a laminate material and/or a glass material.

As shown in FIG. 1, each of the dice 104-108 has different operating temperature tolerance ranges. For example, the processor 104 has an operating temperature tolerance between −40° C. and +125° C., whereas the second memory 108 has an operating temperature tolerance between 0° C. and +70° C.

Typically, each die regulates it own operation based on (i) temperature readings from temperature sensors and (ii) its own temperature tolerance. That is, each die regulates its operation based on temperature measured from temperature sensors and independently of other dice. However, thermal sensors take up valuable space/real estate in a tightly integrated semiconductor device, such as a SiP or SoG. Moreover, in a tightly integrated semiconductor device, the heat from one die may affect other nearby dice. Thus, for example, when the processor 104 operates at a temperature near its higher temperature tolerance range (e.g., +125° C.), the second memory 108 has to shut down because this temperature is too high for the second memory 108, which has a high temperature tolerance of only +70° C. Thus, it is apparent that regulation based only on a die's own temperature tolerance does not address the thermal problems in a tightly integrated, semiconductor device, system, and/or package.

Therefore, there is a need for an improved method for thermal management in a tightly integrated semiconductor device, system, and/or package, such as a SiP and SoG.

SUMMARY

Various features, apparatus and methods described herein provide a thermal management of a tightly integrated semiconductor device, system, and/or package.

A first example provides a semiconductor package that includes a first die and a second die adjacent to the first die. The second die is capable of heating the first die. The semiconductor package includes a leakage sensor is configured to measure a leakage current of the first die. The semiconductor package includes a thermal management unit coupled to the leakage sensor. The thermal management unit is configured to control a temperature of the first die based on the leakage current of the first die.

According to one aspect, the thermal management unit is configured to control the temperature of the first die by controlling heat emanating from the second die based on the leakage current of the first die. In some implementations, controlling the heat emanating from the second die includes reducing activity of the second die based, on the leakage current of the first die.

According to an aspect, the leakage sensor configured to measure the leakage current is a sensor configured to measure a voltage drop in the first die.

According to one aspect, the first die has a thermal tolerance and. the thermal management unit is configured to control the temperature of the first die by controlling heat emanating from the second die based on the thermal tolerance of the first die. In some implementations, controlling the heat emanating from the second die based on the thermal tolerance of the first die comprises determining the temperature of the first die based on the measured leakage current of the first die and comparing the measured temperature to the thermal tolerance of the first die.

According to an aspect, the semiconductor package further includes a heat reducing mechanism coupled to the thermal management unit. In some implementations, the first die is a memory and the heat reducing mechanism is a memory controller. In some implementations, the heat reducing mechanism reduces heat by performing one of at least Dynamic Voltage and Frequency Scaling (DVFS), Dynamic Frequency Scaling (DFS), clock gating, and power collapsing.

According to one aspect, the leakage sensor is separate from the first die. In some implementations, the leakage sensor is part of the first die. In some implementations, the thermal management unit is part of the second die. In some implementations, the first die is stacked on top of the second die. In some implementations, the first die and the second die are coupled to each other by through substrate vias (TSVs).

According to an aspect, the first die, the second die and the thermal management unit are part of at least one of a System in Package (SiP) and System on Glass (SoG).

According to one aspect, the package is incorporated into at least one of a music player, a video player, an entertainment unit, a navigation device, a communications device, a mobile phone, a smartphone, a personal digital assistant, a fixed location terminal, a tablet computer, and/or a laptop computer.

A second example provides an apparatus that includes a first die and a second die adjacent to the first die. The second die is capable of heating the first die. The apparatus includes means for measuring a leakage current of the first die. The apparatus also includes means for controlling a temperature of the first die based, on the leakage current of the first die.

According to one aspect, the means for controlling the temperature of the first die is a means for controlling heat emanating from the second, die based on the leakage current of the first die. In some implementations, the means for controlling the heat emanating from the second die includes a means for reducing activity of the second die based on the leakage current of the first die. In some implementations, the means for measuring the leakage current is a means for measuring a voltage drop in the first die.

According to an aspect, the first die has a thermal tolerance and the means for controlling the temperature of the first die includes a means for controlling heat emanating from the second die based on the thermal tolerance of the first die.

According to one aspect, the means for controlling the heat emanating from the second die based, on the thermal tolerance of the first die includes means for determining the temperature of the first die based on the measured leakage current of the first die and means for comparing the measured temperature to the thermal tolerance of the first die.

According to an aspect, the apparatus further includes a means for a heat reducing mechanism. In some implementations, the first die is a memory and the means for the heat reducing mechanism is a memory controller. In some implementations, the means for the heat reducing mechanism reduces heat by performing one of at least Dynamic Voltage and Frequency Scaling (DVFS), Dynamic Frequency Scaling (DFS), clock gating, and power collapsing.

According to one aspect, the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

A third example provides a method for manufacturing a semiconductor package encapsulating several dice. The method positions a first die on a packaging substrate. The method positions a second die adjacent to the first die. The second die is capable of heating the first die. The method positions a leakage sensor within the package. The leakage sensor is configured to measure a leakage current of the first die. The method positions a thermal management unit within the package. The thermal management unit is coupled to the leakage sensor. The thermal management unit is configured to control a temperature of the first die based, on the leakage current of the first die.

According to one aspect, the thermal management unit is configured to control the temperature of the first die by controlling heat emanating from the second, die based, on the leakage current of the first die. In some implementations, controlling the heat emanating from the second die includes reducing activity of the second die based on the leakage current of the first die.

According to an aspect, the leakage sensor is a sensor configured to measure a voltage drop in the first die.

According to one aspect, the first die has a thermal tolerance and the thermal management unit is configured to control the temperature of the first die by controlling heat emanating from the second die based on the thermal tolerance of the first die.

According to an aspect, controlling the heat emanating from the second die based on the thermal tolerance of the first die includes determining the temperature of the first die based on the measured leakage current of the first die and comparing the measured, temperature to the thermal tolerance of the first die.

According to one aspect, the method further includes positioning a heat reducing mechanism within the package. The heat reducing mechanism is coupled to the thermal management unit. In some implementations, the first die is a memory and the heat reducing mechanism is a memory controller. In some implementations, the heat reducing mechanism reduces heat by performing one of at least Dynamic Voltage and Frequency Scaling (DVFS), Dynamic Frequency Scaling (DFS), clock gating, and power collapsing.

According to an aspect, the package is incorporated into at least one of a music player, a video player, an entertainment unit, a navigation device, a communications device, a mobile phone, a smartphone, a personal digital assistant, a fixed, location terminal, a tablet computer, and/or a laptop computer.

A fourth example provides a semiconductor package that comprises a first die that includes several through substrate vias (TSVs). The semiconductor package also comprises a second die coupled to the several TSVs, The second die is capable of heating the first die via the several TSVs. The semiconductor package also includes a sensor configured to measure a property of the first die. The semiconductor package also includes a thermal management unit coupled to the sensor. The thermal management unit is configured to control a temperature of the first die based on the property of the first die.

According to an aspect, the sensor is one of at least a temperature sensor and/or leakage current sensor.

According to one aspect, the thermal management unit is configured, to control the temperature of the first die by controlling heat emanating from the second die based on the property of the first die.

According to an aspect, the first die, the second die and the thermal management unit are part of at least one of a System in Package (SiP) and System on Glass (SoG).

According to one aspect, the package is incorporated into at least one of a music player, a video player, an entertainment unit, a navigation device, a communications device, a mobile phone, a smartphone, a personal digital assistant, a fixed location terminal, a tablet computer, and/or a laptop computer.

A fifth example provides a method for manufacturing a semiconductor package. The method, positions a first die on a packaging substrate. The first die includes several through substrate vias (TSVs). The method positions a second die adjacent to the first die. The second, die is capable of heating the first die. The first die and the second, die are coupled to each other via the several TSVs. The method positions a sensor within the package. The sensor is configured, to measure a property of the first die. The method positions a thermal management unit within the package. The thermal management unit is coupled to the sensor. The thermal management unit is configured, to control a temperature of the first die based on the property of the first die.

According to one aspect, the sensor is one of at least a temperature sensor and/or leakage current sensor.

A sixth example provides a method for managing temperature in a package that includes a first die and a second die. The method, measures a property of a first die. The first die is coupled to the second die via several through substrate vias (TSVs). The method controls the temperature of the first die by reducing activity of the second die based on the measured property of the first die.

According to one aspect, the property of the first die is a temperature of the first die, the first die being a memory die.

According to an aspect, the property of the first die is a leakage current of the first die, the first die being a memory die.

A seventh example provides a computer readable storage medium that includes one or more instructions for managing temperature in a semiconductor package comprising a first die and a second die, which when executed by at least one processor, causes the at least one processor to measure a property of a first die, the first die coupled to the second die via several through substrate vias (TSVs), The computer readable storage medium also includes one or more instructions for managing temperature in the semiconductor package comprising the first die and the second die, which when executed by at least one processor, causes the at least one processor to control the temperature of the first die by reducing activity of the second die based on the measured property of the first die.

According to one aspect, the property of the first die is a temperature of the first die, the first die being a memory die.

According to an aspect, the property of the first die is a leakage current of the first die, the first die being a memory die.

An eighth example provides a method for managing temperature in a semiconductor package that includes a first die and a second die. The method measures a leakage current of a first die. The method controls the temperature of the first die by reducing activity of the second die based on the leakage current of the first die.

According to one aspect, measuring the leakage current of the first die includes measuring a voltage drop across the first die.

According to an aspect, reducing the activity of the second die reduces heat emanating from the second die.

An ninth example provides a computer readable storage medium that includes one or more instructions for managing temperature in a semiconductor package comprising a first die and a second die, which when executed by at least one processor, causes the at least one processor to measure a leakage current of a first die. The computer readable storage medium also includes one or more instructions for managing temperature in the semiconductor package comprising the first die and the second die, which when executed by at least one processor, causes the at least one processor to control the temperature of the first die by reducing activity of the second die based on the leakage current of the first die.

According to one aspect, the one or more instructions, which when executed by at least one processor, causes the at least one processor to measure the leakage current of the first die includes one or more instructions, which when executed by at least one process, causes the at least one processor to measure a voltage drop across the first die.

According to an aspect, the one or more instructions, which when executed, by at least one processor, causes the at least one processor to reduce the activity of the second die includes one or more instructions, which when executed by at least one process, causes the at least one processor to reduces heat emanating from the second die.

DRAWINGS

Various features, nature and advantages may become apparent from the detailed description set forth below when taken in conjunction with the drawings in which like reference characters identify correspondingly throughout.

10 illustrates a method for manufacturing a semiconductor package that includes a central thermal management unit.

Figure 11:
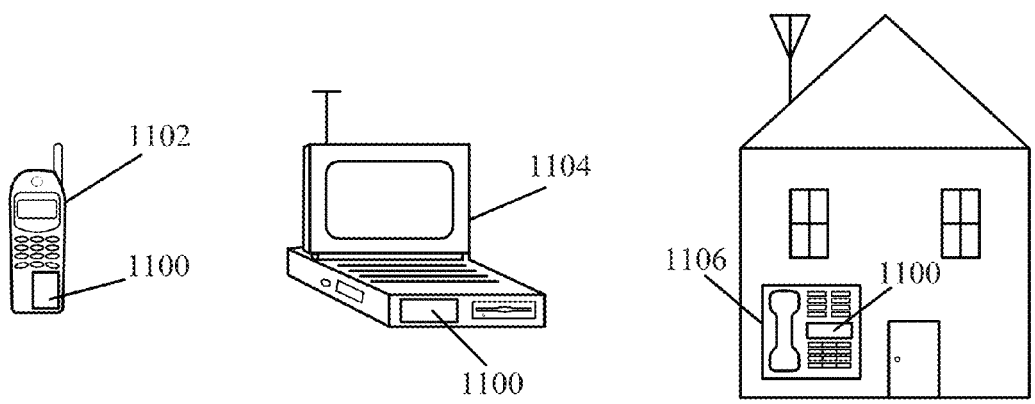

FIG. 11 illustrates various electronic devices that may integrate the IC described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid, obscuring the aspects in unnecessary detail. In other instances, well-known circuits, structures and. techniques may not be shown in detail in order not to obscure the aspects of the disclosure.

Overview

Some implementations provide a semiconductor package that includes a first die and a second die adjacent to the first die. The second die is capable of heating the first die. The semiconductor package includes a leakage sensor is configured to measure a leakage current of the first die. The semiconductor package includes a thermal management unit coupled, to the leakage sensor. The thermal management unit is configured to control a temperature of the first die based on the leakage current of the first die. In some implementations, the thermal management unit is configured to control the temperature of the first die by controlling heat emanating from the second, die based, on the leakage current of the first die. In some implementations, controlling the heat emanating from the second die includes reducing activity of the second die based on the leakage current of the first die. In some implementations, the leakage sensor configured to measure the leakage current is a sensor configured to measure a voltage drop in the first die. In some implementations, the first die has a thermal tolerance and the thermal management unit is configured to control the temperature of the first die by controlling heat emanating from the second die based, on the thermal tolerance of the first die. In some implementations, controlling the heat emanating from the second die based on the thermal tolerance of the first die comprises determining the temperature of the first die based on the measured leakage current of the first die and comparing the measured temperature to the thermal tolerance of the first die.

Figure 1:
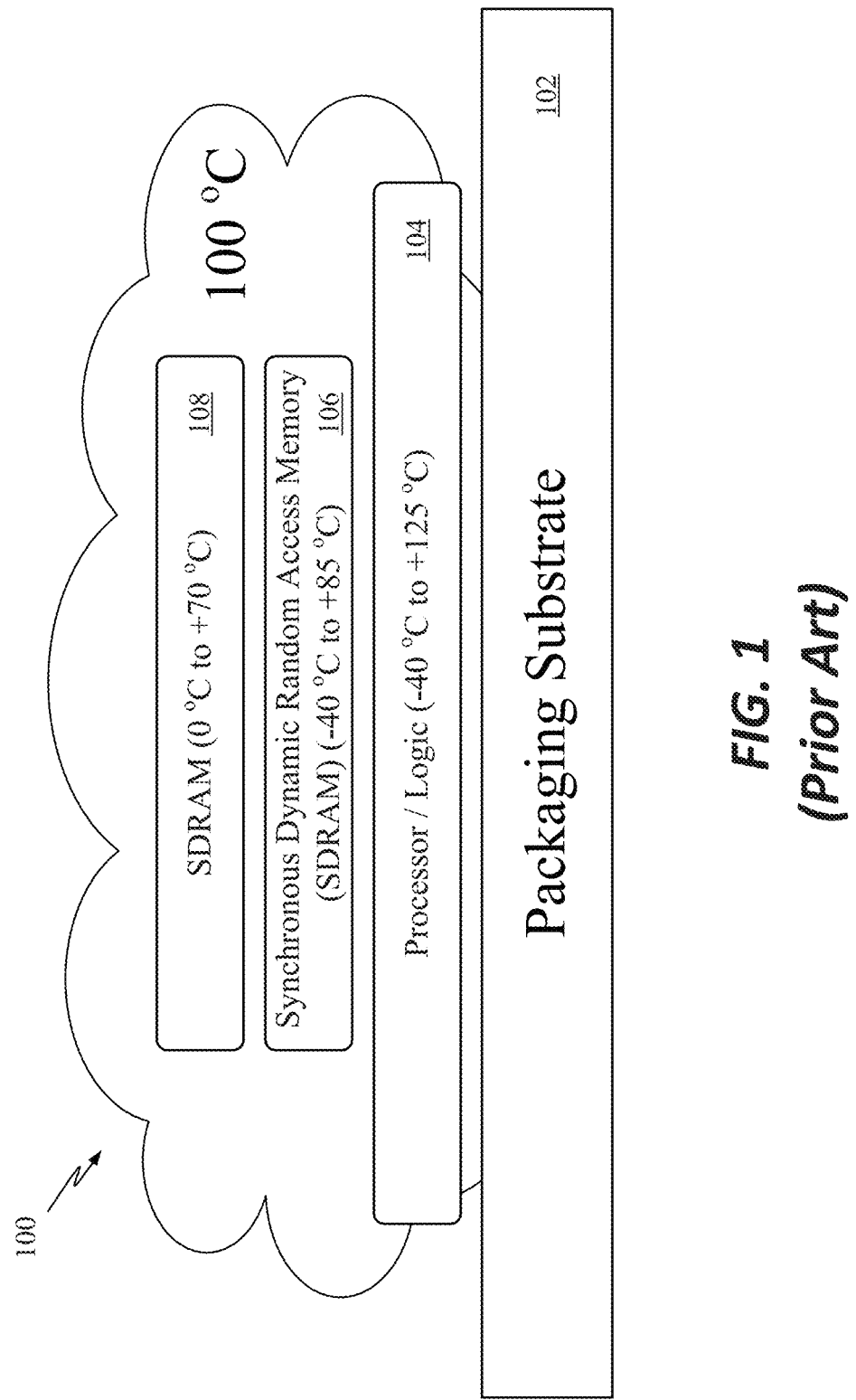
FIG. 1 illustrates a semiconductor package that includes several dice stacked on top of each other.
Figure 2A:
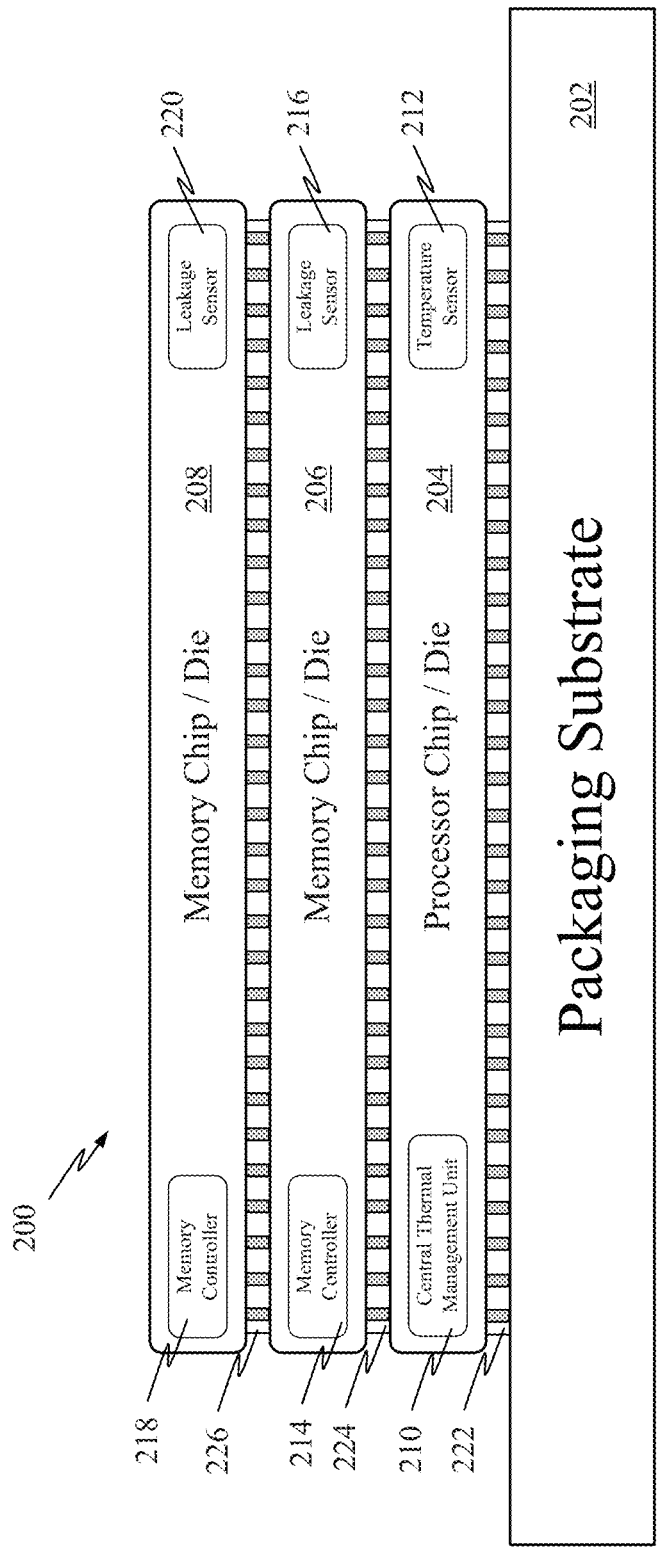
FIG. 2A illustrates a semiconductor package that includes several die having a temperature sensor or leakage sensor.

Exemplary Components of a Thermal Management of Tightly Integrated Semiconductor Device, System and/or Package FIG. 2A illustrates an example of a tightly integrated semiconductor device, system, and/or package 200 in some embodiments. Examples of a tightly integrated, semiconductor device 200 may include System-in-Package (SiP) or System on Glass (SoG). As shown in FIG. 2A, the tightly integrated semiconductor device, system, and/or package 200 may include a packaging substrate 202 and several dice 204-208. The first die is a processor 204 that includes a central thermal management (CTM) unit 210 and a temperature sensor 212. The second die is a first memory 206 that includes a memory controller 214 and a leakage sensor 216. The third, die is a second memory 208 that includes a memory controller 218 and a leakage sensor 220.

The processor 204, the first memory 206 and the second memory 108 are stacked on top of each other. The first memory 206 and the second memory 208 may be any type of memory including static random access memory (SRAM) and dynamic random access memory (DRAM).

As further shown in FIG. 2A, the substrate 202 is coupled to the processor 204 by through substrate vias (TSVs) 222, the processor 204 is coupled to the first memory 206 by TSVs 224 and the first memory 206 is coupled to the second memory 208 by TSVs 226. TSVs provide several advantages over traditional wire bonding. First, TSVs are smaller than wire bonding and therefore more TSVs can be used on a die. Thus, they have higher density input/output (I/O) terminals. Second, TSVs are direct and shorter connections than wire bonding, thereby increasing the speed of the communication between the dice.

However, one drawback of using TSVs is that they conduct more heat from one die to another die than wire bonding. This is due in part, to the higher density die and. the shorter distance between the dice. Thus, any die in a package that utilizes TSVs is more susceptible to overheating caused by another die in the package. This is especially true for a memory die in the package.

As mentioned above, a memory may include a memory controller and a leakage sensor. A memory controller (e.g., memory controller 214) is a controller for controlling the operation of a memory (e.g., first memory 206) and managing the flow of data going to and from the memory. For example, the memory controller may control where to read, and write in the memory. The memory controller may also control the memory bus that connects the memory to other components in the semiconductor device, system, and/or package. FIG. 2A illustrates that the memory controller is part of the memory. However, in some implementations, the memory controller (e.g., memory controller 214) may be separate from the memory (e.g., memory 206), That is, the memory controller may be outside of the memory and/or on a separate die than the memory, A leakage sensor (e.g., leakage sensor 216) is a sensor for measuring the amount of leakage current that escapes from a die. Leakage current is inherent in all dice. Leakage current is current that dissipates through an alternative or unintended path in the die. This occurs because other parts of the die are not perfect insulators and thus current leaks from these imperfect insulators. There is a correlation between the leakage current in a die and the temperature of the die. Typically, as the temperature of a die increases, so does the leakage current of the die. There is also a correlation between leakage current and operating voltage of the die. As the operating voltage increases so does the leakage current. Using these correlations, it is possible to determine the temperature of the die by measuring the leakage current of the die. One of the advantages of this approach is that a separate temperature sensor is no longer required to measure the temperature of the die. Thus, the thermal management of a die can be achieved by using a leakage sensor. FIG. 2A illustrates that the leakage sensor is part of the die (e.g., integrated into the circuit of the die). However, in some implementations, the leakage sensor is separate from the die.

A leakage sensor (e.g., leakage sensor 216) may measure leakage current in a die by measuring the difference in voltage between output and input terminals in the die. This can be achieved, for example, by using a voltage sensor/meter to measure the voltage drop between the output and input pin(s) of the die. The voltage drop in the die indicates the amount of leakage current in the die.

Once the leakage current is measured, the temperature of the die may be determined by using pre-determined correlations between leakage current and temperature. For instance, table look-ups that specify the relationship between leakage current and temperature at various operating voltages may be used to determine the temperature of the die.

Instead or in addition to a leakage sensor, a memory may also include a temperature sensor. A temperature sensor (e.g., temperature sensor 212) is a sensor for measuring temperature (e.g., temperature of the processor 204). The temperature sensor may be part of the die (e.g., integrated into the circuit of the die) or it can be separate from the die. The temperature sensor may be located internally or externally to the die.

The central thermal management unit 210 is the component that monitors the temperature of the processor 204 and the leakage current of the memories 206-208 in the semiconductor device, system, and/or package 200. In addition to monitoring the temperature and the leakage current, the central thermal management unit 210 may also regulate the operation of the dice 204-208 in accordance with the temperature readings from the processor 204 and the leakage readings from the memories 206-208. That is, the central management unit 210 may regulate temperature of the semiconductor device 200 by instructing one or more of the dice 204-208 to reduce activity.

Different embodiments may utilize different approaches to reduce activity of the dice 204-208. For example, when the die is a processor, the central thermal management unit 210 may reduce activity of the processor (e.g., processor 204 which is the die that is the primary heat source) by utilizing Dynamic Voltage and Frequency Scaling (DVFS)/Dynamic Frequency Scaling (DFS), clock gating, power collapsing, or any combination thereof.

When the die is a memory (e.g., memory 206), the central thermal management unit 210 may reduce the activity of the memory by utilizing some or all of the techniques described above for reducing the activity of a processor. That is, the central thermal management unit 210 may reduce the activity of the memory by reducing the clock speed of the memory and/or reducing the clock speed of a memory bus. In lieu of or in conjunction to utilizing the above techniques, the central thermal management unit 210 may also instinct the memory to shut down or idle part of the memory to reduce the activity of the memory. The reduction of the activity of the memory may be throttled linearly or it may be throttled in unit steps (e.g., 1333 MHz, 1066 MHz, 800 MHz).

The central thermal management 210 may directly instruct the memory to reduce activity, or the central thermal management 210 may instruct a memory controller (e.g., memory controller 214) coupled to the memory to reduce activity (indirectly instructing memory to reduce activity). The memory controller may be part of the memory (e.g., integrated into the circuit of the memory die) or it may be part of a separate die. In some implementations, the memory controller that controls the memory is part of the central thermal management 210, or vice versa.

The central thermal management unit 210 may initiate instructions to reduce activity when the leakage readings from at least one of the leakage sensors 216 and 220 reach certain leakage current thresholds/values. For example, when the leakage current of one the dice 206-208 is near or reaches an upper leakage current tolerance, the central thermal management unit 210 may instruct one or more of the dice to reduce activity, The central thermal management unit 210 may also initiate instructions to reduce activity when the temperature readings from the temperature sensor 212 reach certain temperature thresholds/values.

In addition, a central management unit 210 may initiate instructions based on a heuristic approach. That is, for example, a central thermal management unit 210 may rely on some sort of thermal profile to determine whether to reduce activity of one or more the dice 204-208, In such instances, the central management unit 210 may use a lookup table to map thermal thresholds in various dice and apply a rules based, approach.

In some implementations, the central management unit 210 may reduce the activity of one or more of the dice, while increasing the activity of one or more of the other dice. This may occur when one of the dice is a memory die. A memory die (e.g., SDRAM) typically has a lower temperature threshold than other types of die (e.g., processor die).

In the case of a SDRAM, higher temperature means higher leakage current, which means the SDRAM is not able to retain as long the bit values that are stored in the memory array. To offset this loss of data, the SDRAM may increase the refresh rate of the data that is stored in the memory array of the SDRAM. Refresh rate refers to the number of times data is rewritten in a memory for a given period of time. However, refreshing data increases activity and therefore increases heat that is generated. Nonetheless, the heat that is generated by the memory is not as much heat that may be generated by a processor, which typically has higher temperature tolerances.

As an example, a central thermal management unit may detect that the temperature of a package or a memory die (e.g., SDRAM) is near or above a temperature threshold. The central thermal management unit may determine that a processor is the source of the excess heat. As such, the central thermal management unit may instruct the processor to reduce its activity (e.g., reduce clock speed). However, it may take a while before reducing the activity of the processor actually reduces the temperature of the package or memory die. As such, the memory die may still be experiencing higher than normal leakage current, despite the fact that the activity of the processor has been reduced.

As mentioned above, high temperature may lead to leakage current for a memory die, which can lead to loss of data in the memory. Thus, in order to ensure that the memory die is working properly and that no data is loss, some implementations may increase (e.g., temporarily increase) the activity of the memory die (e.g., increase refresh rate of data) while decreasing the activity of the processor. Increasing the activity of the memory die may include increase the clock speed, the bus speed and/or operating voltage of the memory. Since the processor typically has more of an impact on the heat of the package than the memory, increasing the activity of the memory will not necessarily increase the temperature of the package and/or memory, as long as the activity of the processor is sufficiently reduced. Once the temperature of the package and/or memory die has come down (e.g., below a temperature threshold), the central thermal management unit may decrease the activity of the memory, further reducing the temperature of the package and/or memory die.

FIG. 2A illustrates that the central thermal management unit 210 is part of the processor 204 (e.g., central thermal management unit 210 is a circuit in the processor 204). However, in some embodiments, the central thermal management unit 210 is its own separate circuit (e.g., its own die) or is part of another circuit or die (e.g., memory 206) of the semiconductor device 200.

Figure 2B:
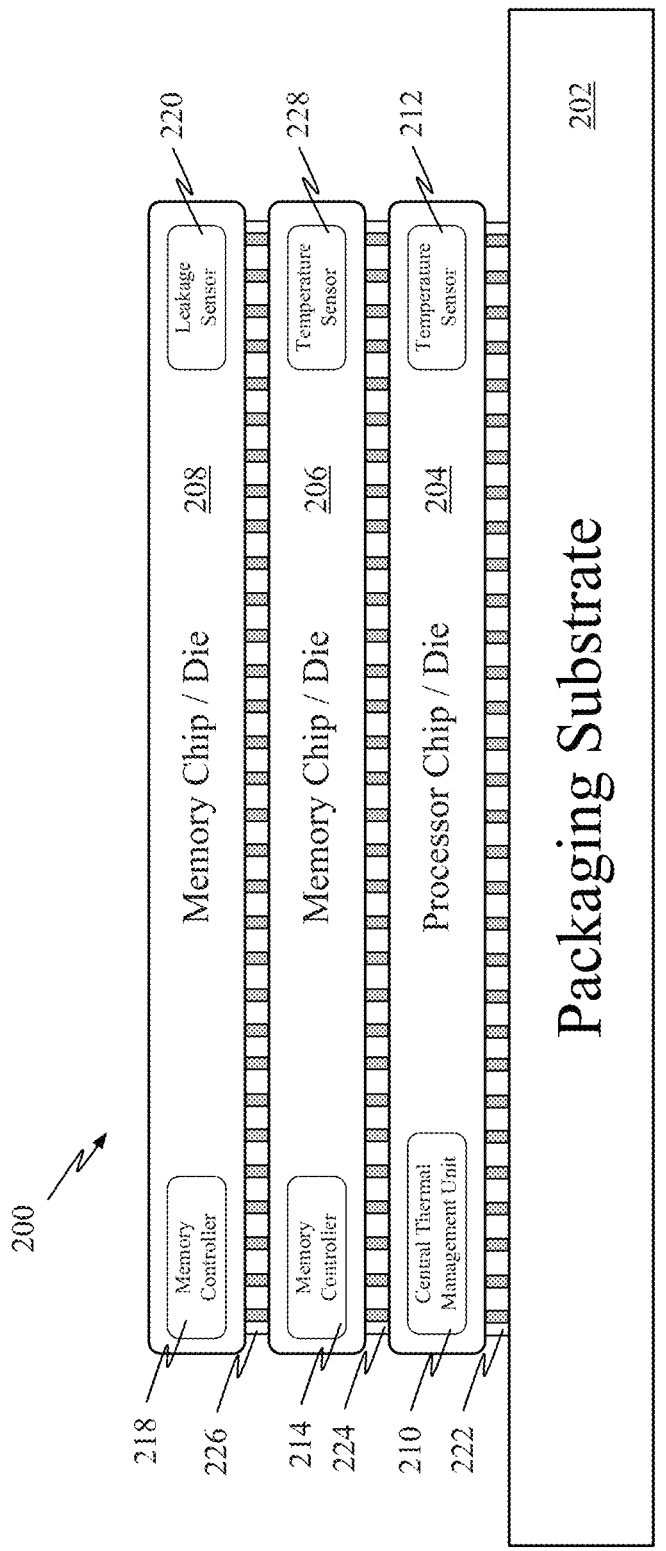
FIG. 2B illustrates a semiconductor package that includes several die having a temperature sensor or leakage sensor.
Figure 2C:
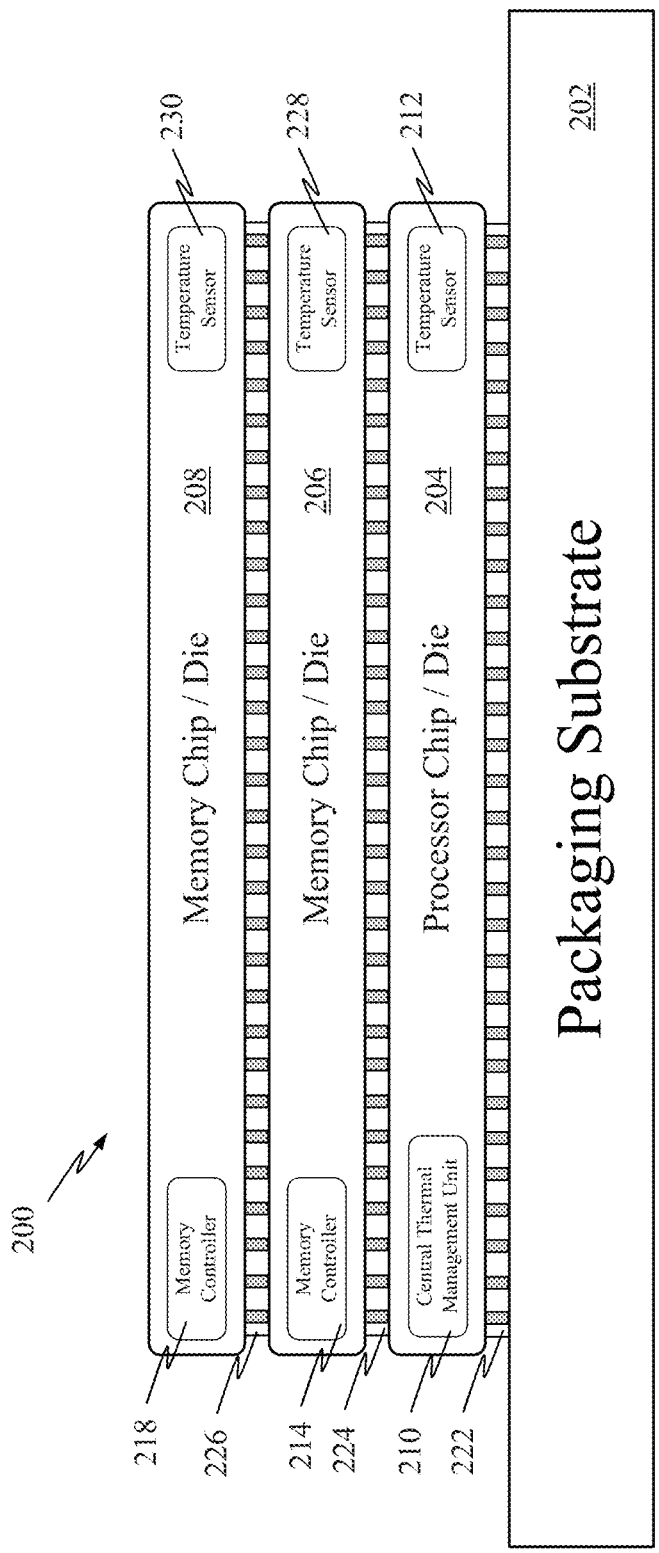
FIG. 2C illustrates a semiconductor package that includes several die each having a temperature sensor.

FIGS. 2B-2C illustrates other possible semiconductor devices, systems, and/or packages that utilize a central thermal management unit. FIG. 2B is similar to FIG. 2A, except that one of the memory die has temperature sensor instead of a leakage sensor. As shown in FIG. 2B, the package 200 (e.g., SiP) includes a processor 204, a first memory 206, and. a second memory 208. The first memory 206 includes a temperature sensor 228, while the second, memory 208 includes a leakage sensor 220. The temperature sensor 212 of the processor 204, the temperature sensor 228 of the first memory 206, and the leakage sensor 220 of the second memory 208 are used in conjunction with the central thermal management unit 210 to regulate, control, and manage the temperature of the package (as a system, or each die of the package) by controlling, regulating, and managing the activity of one or more of the dice in the package.

FIG. 2C is similar to FIG. 2A, except that both memory dice each has a temperature sensor instead of a leakage sensor. As shown in FIG. 2C, the first memory 206 includes a temperature sensor 228 and the second memory 208 includes a temperature sensor 230. The central thermal management unit 210 uses readings from at least the temperature sensors 228-230 to regulate, control, and manage the temperature of the package and/or activity of the dice.

Having described the various components and parts of a package (e.g., SoG) that includes several dice, the operation of a central thermal management unit in the semiconductor device, system, and/or package will now be described below.

Figure 3:
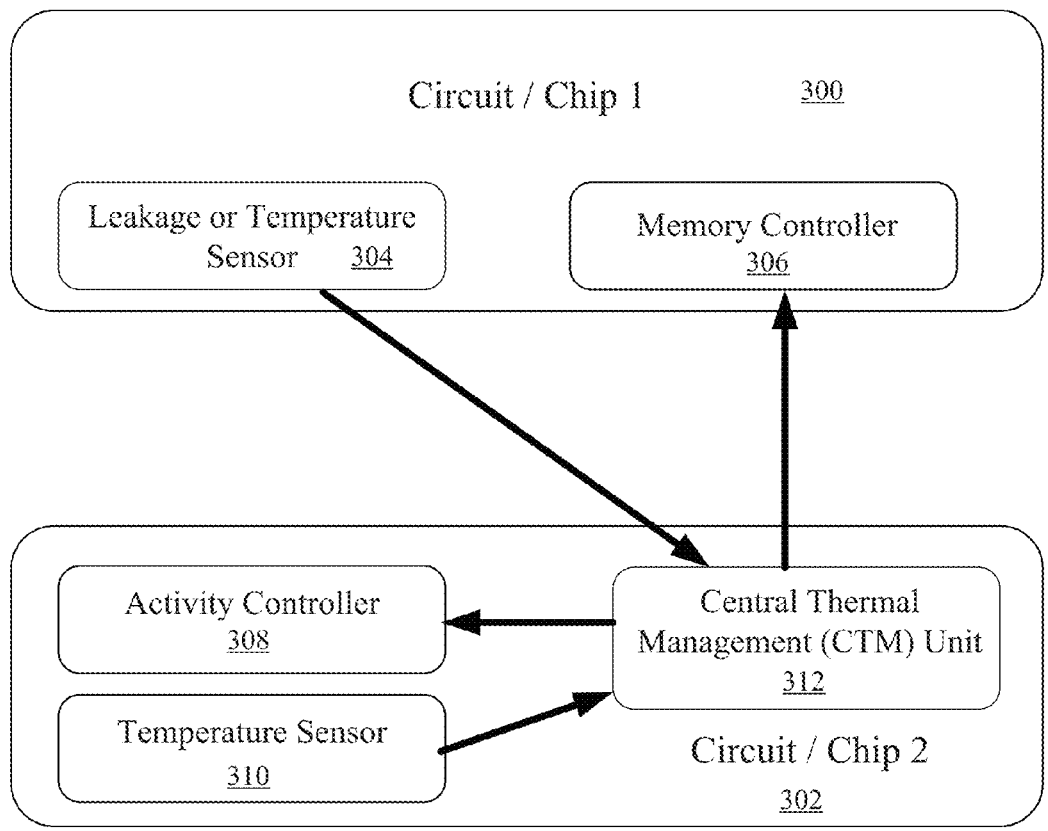
FIG. 3 illustrates a conceptual illustration of how a central thermal management unit regulates the activity of dice based on leakage current readings and/or thermal readings.

Exemplary Operation of Central Thermal Management Unit in a Tightly Integrated Semiconductor Device, System, and/or Package FIG. 3 illustrates a conceptual illustration of how a central thermal management unit regulates the activity of dice based on leakage current readings and/or temperature readings. Specifically, FIG. 3 illustrates a first circuit 300 and. a second circuit 302. The first circuit 300 may be part of a first die/chip, while the second circuit 302 may be part of a second die/chip that is different than the first die/chip. The first circuit 300 may be a memory (e.g., memory chip) and the second circuit 302 may be a processor (e.g., processor chip). The first circuit 300 has a sensor 304 and a memory controller 306. The sensor 304 may be a leakage sensor or a temperature sensor. The second circuit 302 has an activity controller 308, a temperature sensor 310 and a central thermal management (CTM) unit 312.

The central thermal management unit 312 receives data from the sensor 304 and/or temperature data from the temperature sensor 310. When the sensor 304 is a leakage sensor, the central thermal management unit 312 may receive leakage current data from the sensor 304. If the leakage sensor is a voltage sensor/meter then the central management unity 312 may receive voltage data. However, when the sensor 304 is a temperature sensor, the central thermal management unit 312 may receive temperature data from the sensor 304. Based on the received data and. a threshold value, the central thermal management unit 312 determines whether or not the activity of the first circuit 300 and/or the second circuit 302 needs to be reduced.

If the activity of the first circuit 300 needs to be reduced, the central thermal management unit 312 communicates with the memory controller 306 and instructs the memory controller 306 to reduce the activity of the first circuit 300, The activity of the first circuit 300 may need to be reduced, when the leakage current of the first circuit 300 approaches, reaches, or passes a certain leakage current threshold value. In some implementations, the activity of the first circuit 300 is reduced when a voltage drop in the first circuit 300 satisfies a certain voltage drop threshold value (e.g., when the voltage drop in the die is higher than a maximum voltage drop value). The activity of the first circuit 300 may also need to be reduced when the temperature of the first circuit 300 approaches, reaches, or passes a certain threshold temperature value.

As mentioned above, the activity of a circuit may be reduced by utilizing different throttling techniques. When the circuit is a memory (e.g., first circuit 300), the central management unit 312 may for example, instruct the memory controller 306 to reduce the operating voltage of the first circuit 300 and/or slow down the clock cycle or bus of the first circuit 300. Thus, the central management unit 312 specifies which technique to use to reduce the activity of the first circuit. However, in some implementations, the central management unit 312 may simply instruct the memory controller 306 to reduce the activity of the first circuit 300 and the memory controller 306 makes the actual determination as to which technique to use to reduce the activity of the first circuit 300. In some implementations, the reduction in activity of the first circuit 300 is performed until the leakage current no longer satisfies a leakage threshold current value (e.g., leakage current is below a tolerance leakage current value) or until the temperature of the first circuit no longer satisfies a temperature threshold value (e.g., maximum temperature). In instances when voltage is used to determine leakage current, then activity is reduced, until a voltage drop no longer satisfies a voltage drop threshold, value. In addition, different implementations may use multiple leakage current threshold, values (e.g., different values for different operating voltages of the circuit).

If the activity of the second circuit 302 needs to be reduced, the central thermal management unit 312 communicates with the activity controller 308 and. instincts the activity controller 308 to reduce the activity of the second circuit 302. By reducing the activity of the second circuit 302, the heat emanating from the second circuit 302 is reduced which then reduces the temperature of the first circuit 300.

The activity of the second circuit 302 may be reduced for various reasons. In some implementations, the activity of the second circuit 302 is reduced when the leakage current for the first circuit 300 approaches, reaches, or passes a certain leakage current threshold value. Similarly, the activity of the second circuit 302 is reduced when a voltage drop in the first circuit 300 is satisfies a certain voltage drop threshold value. In some implementations, the activity of the second circuit 302 may be reduced when a temperature reading from the sensor 304 of the first circuit 300 satisfies a temperature threshold value (e.g., maximum temperature). In addition, the activity of the second. circuit 302 may be reduced when the temperature reading of the second circuit 302 satisfies a certain temperature threshold value (e.g., maximum temperature).

Although, the central thermal management unit 312 and the activity controller 308 are shown as two separate units/modules, in some implementations, the central thermal management unit 312 and. the activity controller 308 are part of the same unit or module. Alternatively, the central thermal management unit 312 may be located in the first circuit 300 instead of the second circuit 302. In such instances, the central thermal management unit 312 may be separate from the memory controller 306 or the central thermal management unit 312 may be part of the memory controller 306.

It should be noted that communication between the central thermal management unit and the memory controller, activity controller and. sensors may occur in both directions and is not limited to one way communication. For example, the memory controller 306 may provide data and communicate with the central thermal management unit 312.

Figure 4:
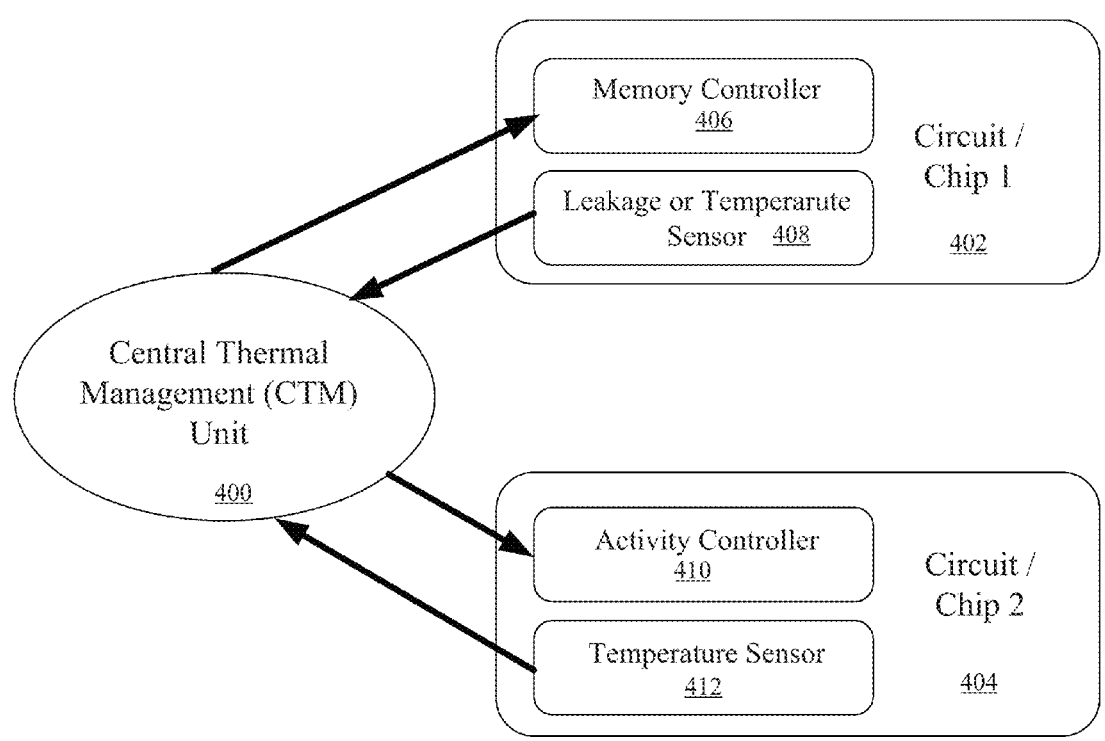
FIG. 4 illustrates another conceptual illustration of how a central thermal management unit regulates the activity of dice based on leakage current readings and/or thermal readings.

FIG. 4 illustrates another conceptual illustration of how a central thermal management unit regulates the activity of circuits based on leakage current readings and/or thermal readings (e.g., temperature readings). FIG. 4 illustrates a central thermal management unit 400, a first circuit 402 and a second circuit 404. FIG. 4 is similar to FIG. 3, except that the central thermal management unit 400 is separate from the two circuits 402-404 (e.g., on a separate die than the circuits 402-404). The central thermal management unit 400 may be its own circuit or it may be part of another circuit (e.g., in another die) in a tightly integrated, semiconductor device, system, and/or package (e.g., SiP, SoG). The central thermal management unit 400 may also be software / code located on a computer readable storage medium. The first circuit 402 includes a memory controller 406 and a sensor 408. The first circuit 402 may be a memory die. The sensor 408 may be a leakage sensor or a temperature sensor. The second circuit 404 has an activity controller 410 and a temperature sensor 412. The second circuit 404 may be a processor or part of a processor.

The central thermal management unit 400 receives data from the sensor 408 and/or temperature data from the temperature sensor 412. When the sensor 408 is a leakage sensor, the central thermal management unit 400 may receive leakage current data from the sensor 408. The leakage current data may be current data or voltage data. However, when the sensor 408 is a temperature sensor, the central thermal management unit 400 may receive temperature data from the sensor 408. Based on the received leakage current data and/or temperature data, the central thermal management unit 400 determines whether or not the activity of first circuit 402 and/or the second circuit 404 needs to be reduced.

If the activity of the first circuit 402 needs to be reduced, the central thermal management unit 400 communicates with the memory controller 406 and instructs the memory controller 406 to reduce the activity of the first circuit 402. In some implementations, the central thermal management unit 400 specifies which technique to use to reduce the activity of the first circuit 402, In some implementations, the central thermal management unit 400 instructs the memory controller 406 to reduce the activity of the first circuit 402, but the memory controller 406 determines which technique to use to reduce the activity of the first circuit 402.

If the activity of the second circuit 404 needs to be reduced, the central thermal management unit 400 communicates with the activity controller unit 410 and instructs the activity controller unit 410 to reduce the activity of the second circuit 404.

Again, it should be noted that communication between the central thermal management unit and the memory controller, activity controller and sensors may occur in both directions and is not limited to one way communication. For example, the memory controller 406 and/or activity controller 410 may provide data and. communicate with the central thermal management unit 400.

Having described various implementations of a central thermal management unit for multiple dice, various flow diagrams of that a central thermal management unit may perform will now be described.

Figure 5:
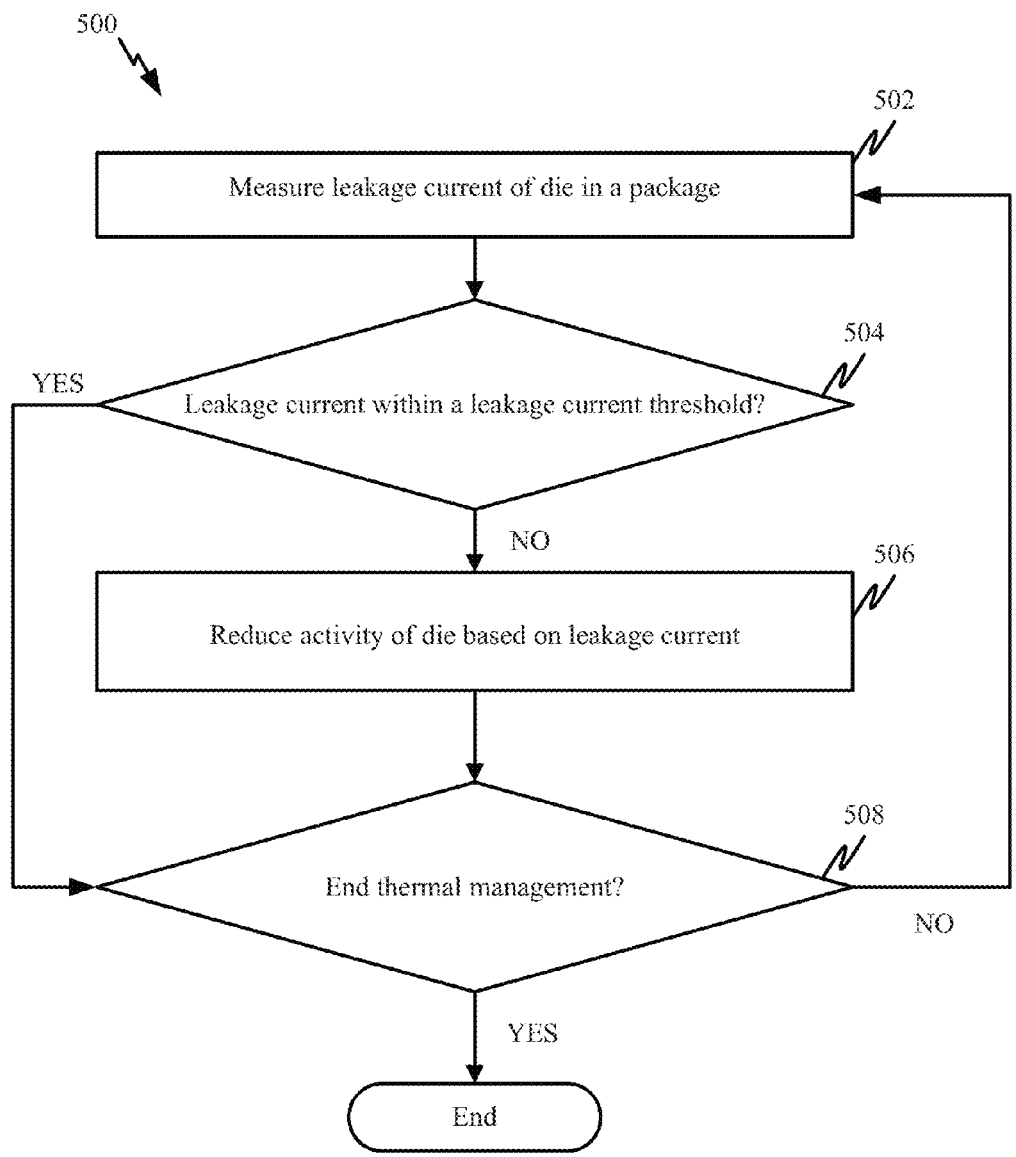
FIG. 5 illustrates a flow diagram of a process that a central thermal management unit may perform to regulate one or more dice.

FIG. 5 illustrates a flow diagram of a method that a central thermal management unit may perform to regulate one or more dice and/or circuits. As shown in FIG. 5, the method measures (at 502) the leakage current of a die (e.g., memory die in a package). Different implementations may measure the leakage current differently. In some implementations, the method may measure leakage current by measuring a voltage drop across the die. Once the leakage current is measured, the method determines (at 504) whether the leakage current is within a leakage current threshold value. Again, different implementations may make this determination differently. In some implementations, the method may compare the measured leakage current to a maximum leakage current value. In other implementations, the method may compare a measured, voltage drop of the die to a voltage drop threshold value (e.g., maximum voltage drop for a given operating voltage). In yet another implementation, the method may determine the temperature of the die based on the measured leakage current and compare the determined temperature to an allowable temperature threshold value (e.g., maximum temperature).

If the method determines (at 504) that the leakage current is not within a leakage current threshold value, then the method proceeds to reduce (at 506) the activity of the die (e.g., first die). The method may reduce the activity of the die by using any of the techniques described above. For instance, the method may instruct a memory controller to reduce the activity of the die. This may be done by utilizing any of the techniques mentioned above (e.g., Dynamic Voltage and Frequency Scaling (DVFS)/Dynamic Frequency Scaling (DFS), clock gating, power collapsing).

However, if the method determines (at 504) that the leakage current is within a leakage current threshold value or after reducing (at 506) the activity of the die, the method determines (at 508) whether to end the thermal management of the package. If method determines (at 508) not to end the thermal management, the method proceeds back to 502 to measure another leakage current. However, the method ends when the method determines (at 508) to end the thermal management of the package.

FIG. 5 illustrates a flow diagram of a method that a central thermal management unit may perform on one die. Although the method of FIG. 5 may be implemented in a package that includes multiple dice. Another flow diagram of a method that a central thermal management unit may perform will now be described.

Figure 6:
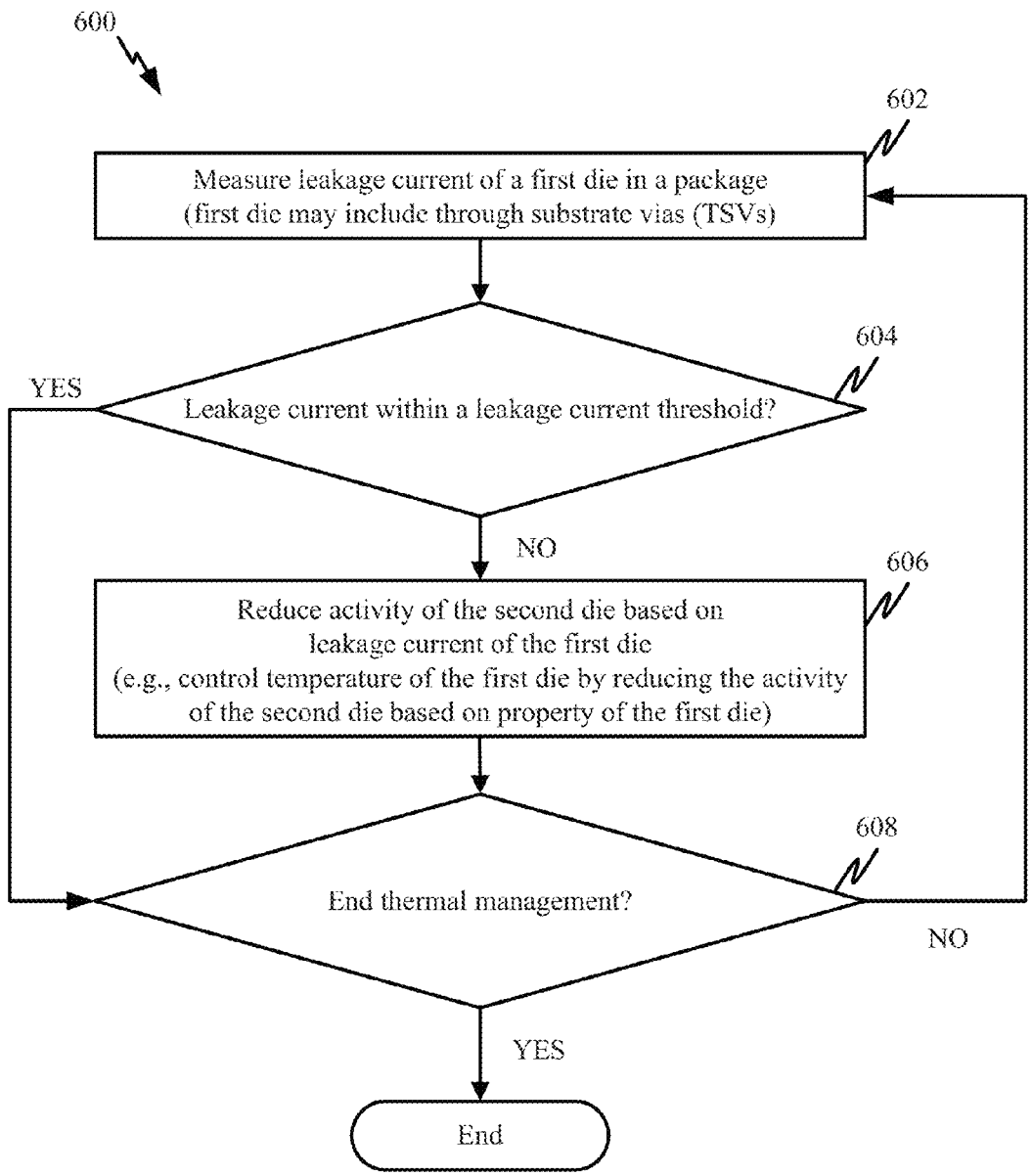
FIG. 6 illustrates another flow diagram of a process that a central thermal management unit may perform to regulate one or more dice.

FIG. 6 illustrates a flow diagram of a method that a central thermal management unit may perform to regulate one or more dice and/or circuits. FIG. 6 is similar to FIG. 5, except that FIG. 6 relates to the reduction in activity of a second die in a package based on the leakage current of a first die in a package. The method of FIG. 6 may be performed in a package that includes two dice that are coupled to each other by through substrate vias (TSVs). The TSVs may be located in the first die and/or the second die.

As shown in FIG. 6, the method measures (at 602) the leakage current of a first die in a package (e.g., memory die). As mentioned above, different implementations may measure the leakage current differently. In some implementations, the method may measure leakage current by measuring the voltage drop across a first die. Once the leakage current is measured (at 602), the method determines (at 604) whether the leakage current of the first die is within a leakage current threshold value. Again, different implementations may make this determination differently. In some implementations, the method may compare the measured, leakage current value to a maximum leakage current value. In other implementations, the method may compare a measured voltage drop of the first die to a voltage drop threshold value (e.g., maximum voltage drop for a given operating voltage). In yet another implementation, the method, may determine the temperature of the first die based on the measured leakage current and compare the determined temperature to an allowable temperature threshold value (e.g., maximum temperature).

If the method determines (at 604) that the leakage current is not within a leakage current threshold value, then the method proceeds to reduce (at 606) the activity of a second die in the package. In some implementations, the method may control the temperature of the first die by reducing the activity of the second die based on property (e.g., leakage current, voltage drop) of the first die. The method may reduce the activity of the second die using any of the techniques described above. For instance, when the second die is a memory die, the method, may instruct a memory controller to reduce the activity of the second die. When the second die is a processor, the method may instruct an activity controller unit to reduce the activity of the processor. This may be done by utilizing any of the techniques mentioned above (e.g., Dynamic Voltage and Frequency Scaling (DVFS)/Dynamic Frequency Scaling (DFS), clock gating, power collapsing).

However, if the method determines (at 604) that the leakage current is within a leakage current threshold value or after reducing (at 606) the activity of the second die, the method determines (at 608) whether to end the thermal management of the package. If method determines (at 608) not to end the thermal management, the method, proceeds back to 602 to measure another leakage current. However, the method ends when the method determines (at 608) to end the thermal management of the package.

FIGS. 5-6 illustrate flow diagrams when the sensor in a first die is a leakage sensor. As mentioned above, in some implementations, the sensor may be a temperature sensor.

Figure 7:
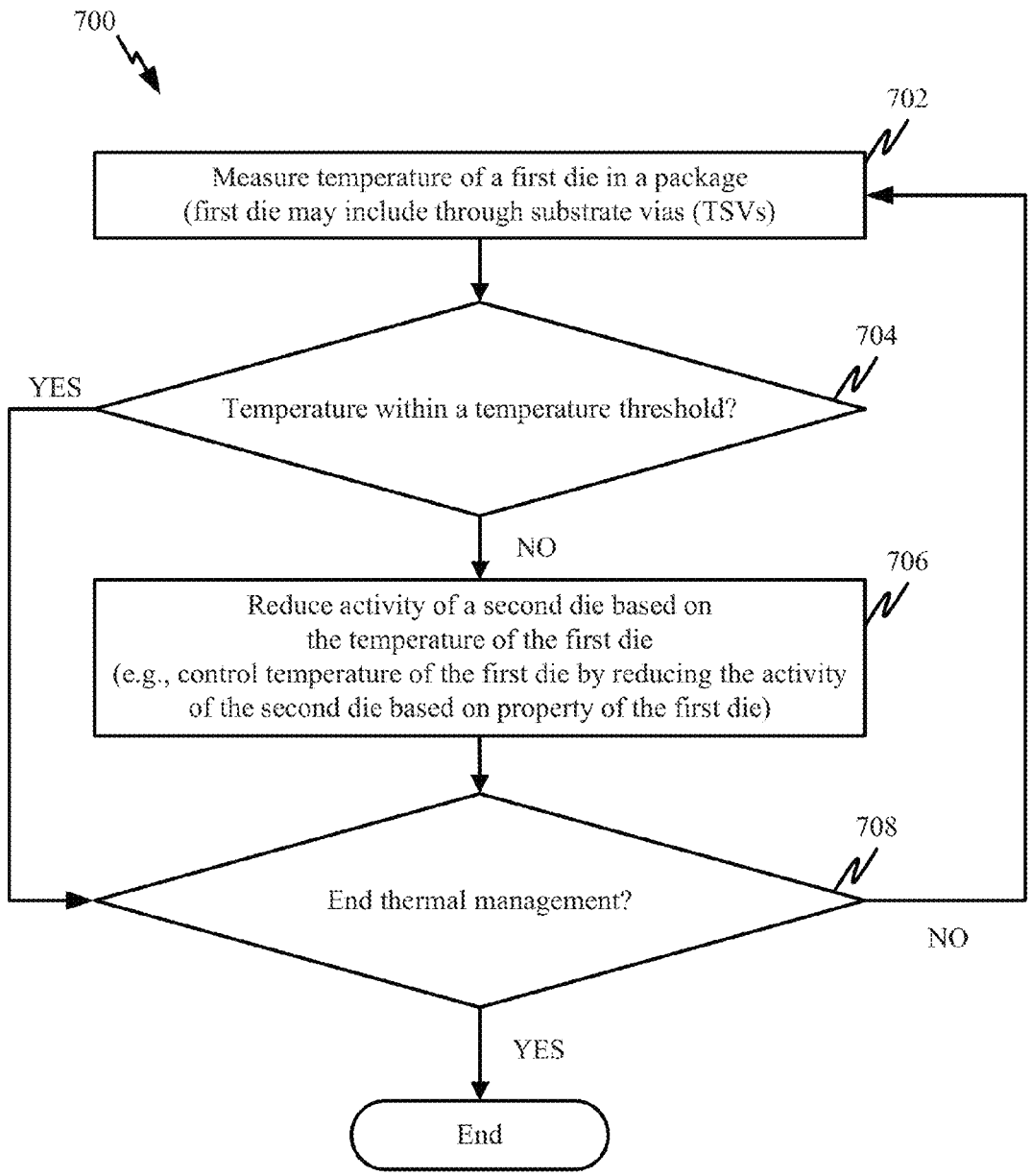
FIG. 7 illustrates another flow diagram of a process that a central thermal management unit may perform to regulate one or more dice.

FIG. 7 illustrates a flow diagram of a method that a central thermal management unit may perform to regulate one or more dice when the sensor is temperature sensor, FIG. 7 is similar to FIG. 6, except that FIG. 7 illustrates a method based, on temperature readings. The method of FIG. 7 may be performed in a package that includes two dice that are coupled to each other by through substrate vias (TSVs). The TSVs may be located in the first die and/or the second die.

As shown in FIG. 7, the method measures (at 702) the temperature of a first die in a package. The first die may be a memory die. In some instances, a temperature sensor is used to measure the temperature of the first die. The first die may include through substrate vias (TSVs). Once the temperature is measured (at 702), the method determines (at 704) whether the temperature of the first die is within a temperature threshold value. Again, different implementations may make this determination differently. In some implementations, the method may compare the measured temperature to a maximum temperature value.

If the method determines (at 704) that the temperature is not within a temperature threshold value, the method proceeds to reduce (at 706) the activity of a second die in the package. In some implementations, the method, may control the temperature of the first die by reducing the activity of the second die based on property (e.g., temperature) of the first die. The method may reduce the activity of the second die using any of the techniques described above. For instance, when the second die is a processor, the method may instruct an activity controller unit to reduce the activity of the second die. This may be done by utilizing any of the techniques mentioned above (e.g., Dynamic Voltage and Frequency Scaling (DVFS)/Dynamic Frequency Scaling (DFS), clock gating, power collapsing). When the second die is a memory die, the method may instruct a memory controller to reduce the activity of the second die.

However, if the method determines (at 704) that the temperature is within a threshold, temperature value or after reducing (at 706) the activity of the second die, the method determines (at 708) whether to end the thermal management of the package. If method determines (at 708) not to end the thermal management, the method proceeds back to 702 to measure another temperature. However, the method ends when the method determines (at 708) to end the thermal management of the package.

In some implementations, the methods of FIGS. 6-7 may also measure the temperature of the second die in the package and may reduce the activity of the second die based at least in part to the measured temperature of the second die. In such instances, the method may measure the temperature of the second die at 602 of FIG. 6 (or at 702 of FIG. 7) or at a point prior to reducing the activity of the second die at 606 of FIG. 6 (or at 706 of FIG. 7). Moreover, when the temperature of the second die is measured, the method may take into account the measured temperature in conjunction or separately from the measured leakage current or temperature of the first die when reducing the activity of the second die. In addition, in some implementations, the methods of FIGS. 5-7 are performed several times in order to get the temperature of the first die within tolerable ranges.

Moreover, FIGS. 5-7 illustrate flow diagrams that reduce the activity of the dice. However, in some implementations, the above methods of FIGS. 5-7 may be used, to control and limit increases in activity of the die. That is, the central thermal management unit may be used to limit any potential increase initiated by a memory controller and/or an activity controller unit. Moreover, the central management unit may also initiate increases in activity of the die when doing so would not cause the die to exceed temperature tolerances and/or leakage current threshold values. Thus, the central management unit may act as a safeguard, and/or gate keeper for the activity of dice.

As described, above, in some instances, the central thermal management unit may increase the activity of one or more dice. For example, in some implementations, the central thermal management unit may decrease the activity of a processor in a package while increasing the activity of a memory die. This process may be done concurrently or sequentially. The increase in activity of the memory die may be temporary and is done to ensure that no data is loss when temperatures are at the higher end of the memory's temperature tolerance range. As previously discussed, at higher temperatures, a memory die (e.g., SDRAM) may be subject to higher leakage current, which leads to higher data loss rate. To mitigate or minimize the data loss, the refresh rate of the memory is increased. The refresh rate may be maintained at a higher level until the temperature of the memory die and/or package comes down due to the decrease in activity of the processor, which is the primary source of heat in the package. Once the temperature has been reduced, the activity of the memory die may be reduced to a normal level or appropriate level.

Moreover, in some implementations, the methods of FIGS. 6-7 may also measure the temperature of the second die in the package and may reduce the activity of the second die based at least in part to the measured temperature of the second die. In such instances, the method may measure the temperature of the second die at 602 of FIG. 6 (or at 702 of FIG. 7) or at a point prior to reducing the activity of the second die at 606 of FIG. 6 (or at 706 of FIG. 7). Moreover, when the temperature of the second die is measured, the method may take into account the measured, temperature in conjunction or separately from the measured leakage current or temperature of the first die when reducing the activity of the second die. In some implementations, the methods of FIGS. 5-7 are performed several times in order to get the temperature of the first die within tolerance ranges.

Figure 8:
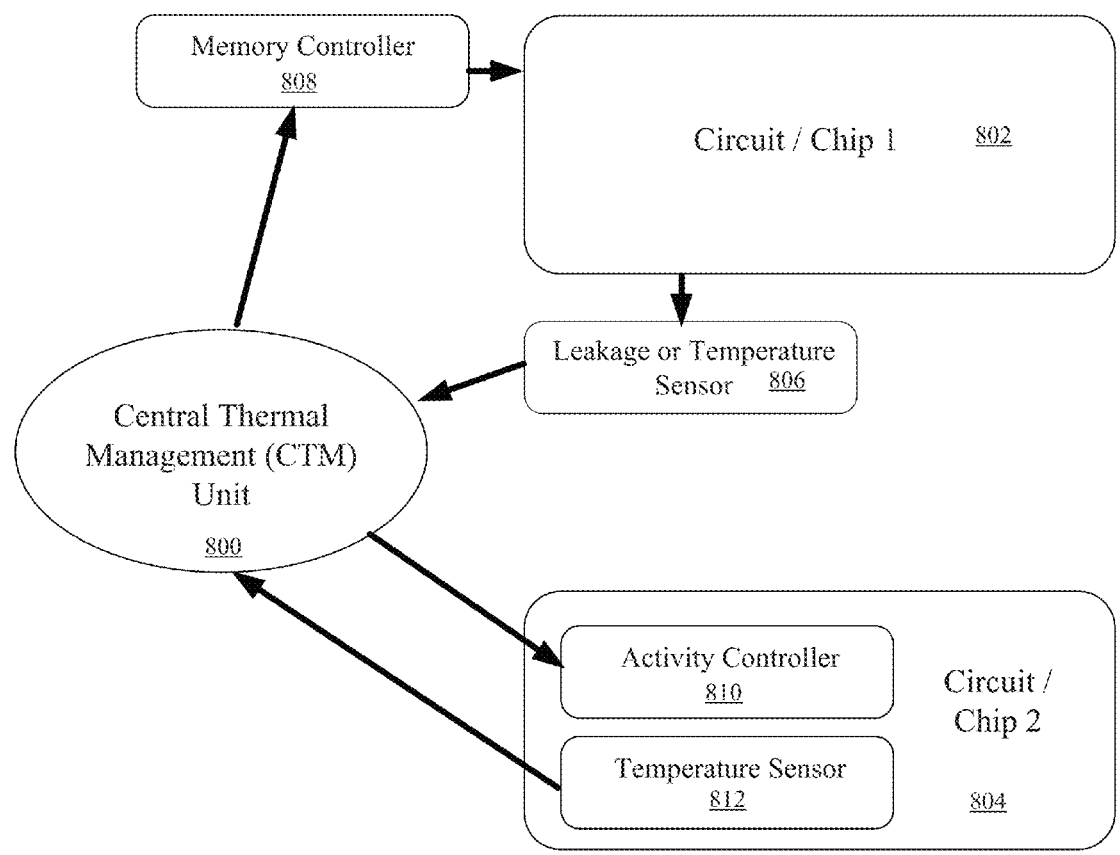
FIG. 8 illustrates another flow diagram of a process that a central thermal management unit may perform to regulate one or more dice.

FIG. 8 illustrates yet another conceptual illustration of how a central thermal management unit regulates the activity of circuits based on leakage current readings and/or temperature readings. FIG. 8 illustrates a central thermal management unit 800, a first circuit 802, a second circuit 804, a sensor 806 and a memory controller 808. The first and second circuits 802-804 may be dice or may be circuits that are part of dice. The sensor 806 may be a leakage sensor or a temperature sensor. FIG. 8 is similar to FIG. 4 except that the sensor 806 and the memory controller 808 are separate from the first circuit 802. The second circuit 804 has an activity controller unit 810 and a temperature sensor 812.

The central thermal management unit 800 receives data from the sensor 806 and/or temperature data from the temperature sensor 812. When the sensor 806 is a leakage sensor, the central thermal management unit 800 may receive leakage current data from the sensor 806. However, when the sensor 806 is a temperature sensor, the central thermal management unit 800 may receive temperature data from the sensor 806. Based on the received leakage current data and/or temperature data, the central thermal management unit 800 determines whether or not the activity of the first circuit 802 and/or the second, circuit 804 needs to be reduced. If the activity of the second, circuit 804 needs to be reduced, the central thermal management unit 800 communicates with the activity controller unit 808 and instructs the activity controller 808 to reduce the activity of the second circuit 804.

In some implementations, the central thermal management unit may manage and control the temperature of a package by using the temperature sensor of the processor in the package, but utilizing the temperature tolerance range of the other dice (e.g., memory die) in the package. Using temperature profiles and modeling, the central thermal management unit may measure the temperature at the processor and using this temperature, predict and/or approximate the temperature of the package and/or other dice in the package. If the temperature profile and/or model predict the temperature of nearby dice or the package will be beyond, a certain threshold value, the central thermal management unit may reduce the activity of the processor. Thus, this approach allows for thermal management of a package without having to rely on numerous sensors.

FIGS. 2A-2C, 3, 4, 8 illustrate the processor has having a temperature sensor. However, in some implementations, the processor may have a leakage sensor. In addition, the memory and the processor may each have multiple sensors, including combinations of leakage sensors and temperature sensors.

Figure 9:
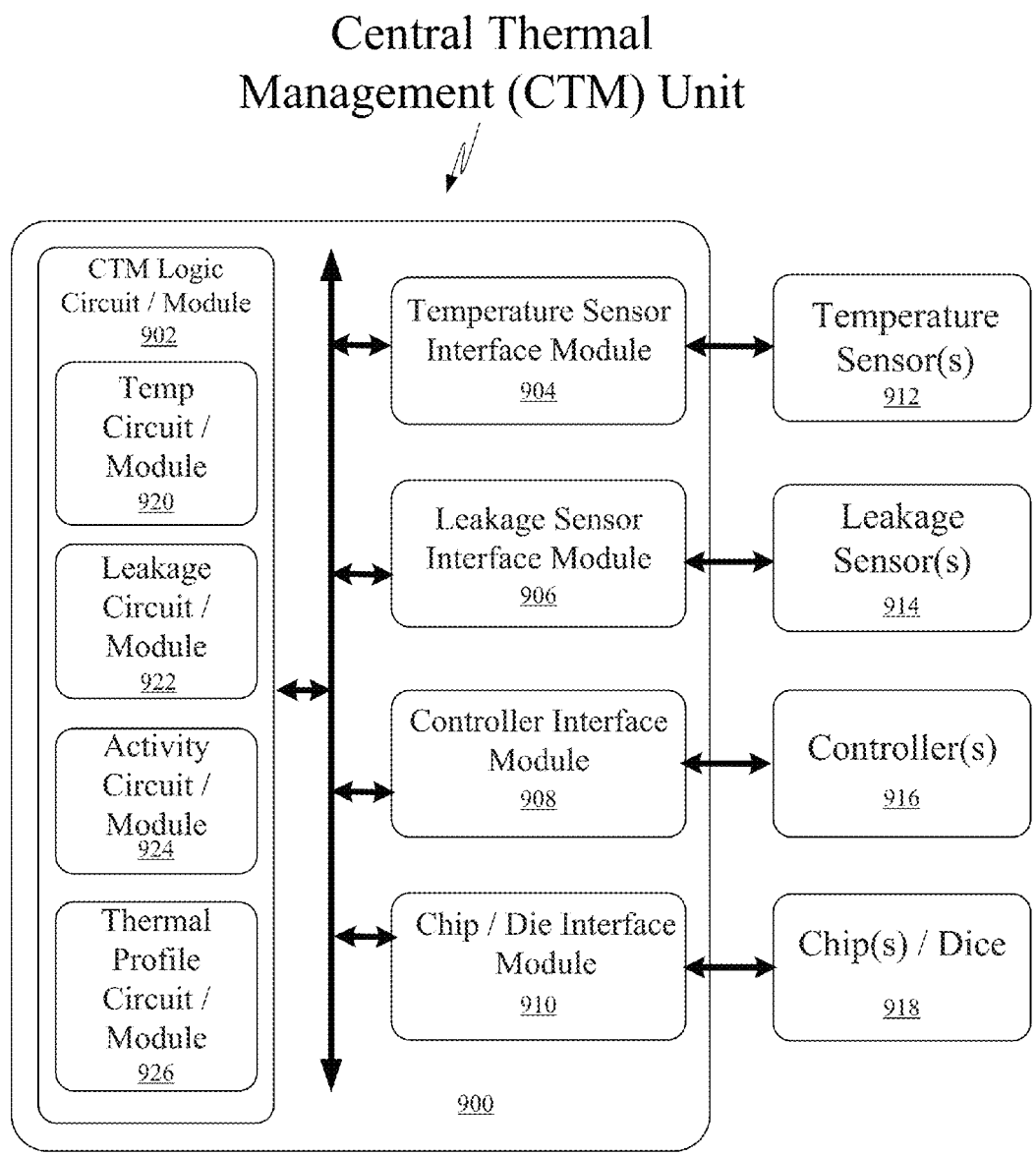
FIG. 9 illustrates a central thermal management unit.

In the above figures, numerous references are made to a central thermal management unit. The central thermal management unit may be implemented, in a package in many ways. FIG. 9 conceptually illustrates a central thermal management unit 900 that may be in a package (e.g., SiP, SoG). The central thermal management unit 900 may be part of circuit of a die (e.g., processor) or it may be its own die in the package. The central thermal management unit 900 may also be code that is stored in a computer/processor readable storage medium. The central thermal management unit 900 may also be a semiconductor device, system and/or package or part of a semiconductor device, system, and/or package distributed across several circuits and/or dice in a package.

As shown in FIG. 9, the central thermal management unit 900 includes a central thermal management (CTM) logic circuit/module 902, a temperature sensor interface module 904, a leakage sensor interface module 906, a controller interface module 908, and a chip/die interface module 910. The CTM logic circuit/module 902 performing the thermal management of the die and/or package, by controlling and managing the temperature and activity of the dice in the package. The CTM logic circuit/module 902 may utilizes the techniques described above to control and. manage the temperature and activity of the dice in the package, including using thermal profiles and look-up tables.

The CTM logic circuit/module 902 may be coupled to the temperature sensor interface module 904, which allows the CTM logic module 902 to receive data from temperature sensors 912. The CTM logic circuit/module 902 may also be coupled to the leakage sensor interface module 906 to allow the CTM logic circuit/module 902 to receive data from leakage sensors 914. As shown in FIG. 9, the CTM logic circuit/module 902 may further be coupled the controller interface module 908, which allows the CTM logic circuit/module 902 to communicate back and forth with controllers 916 (e.g., memory controller, activity controller). Finally, the CTM logic circuit/module 902 may also be coupled to the chip/die interface module 910, which allows the CTM logic circuit/module 902 to communicate with the dice 918.

The CTM logic circuit/module 902 may also include a temperature circuit/module 920, a leakage circuit/module 922, an activity circuit/module 924, a thermal profile circuit/module 926. The temperature circuit/module 920 is for analyzing temperature data. The leakage circuit/module 922 is for analyzing leakage current data, including voltage drop data. The activity circuit/module 924 is for determining and controlling the activity of dice. This includes whether to increase or decrease the activity of a die. The thermal profile circuit/module 926 is for storing data related to thermal profiles and/or modeling of the package.

Having described various structural and operational implementations of a central thermal management unit, a method for manufacturing a package (e.g., SiP, SoG) that includes a central thermal management unit will now be described below.

Exemplary Manufacturing a Package with a Central Thermal Management Unit

Figure 10:
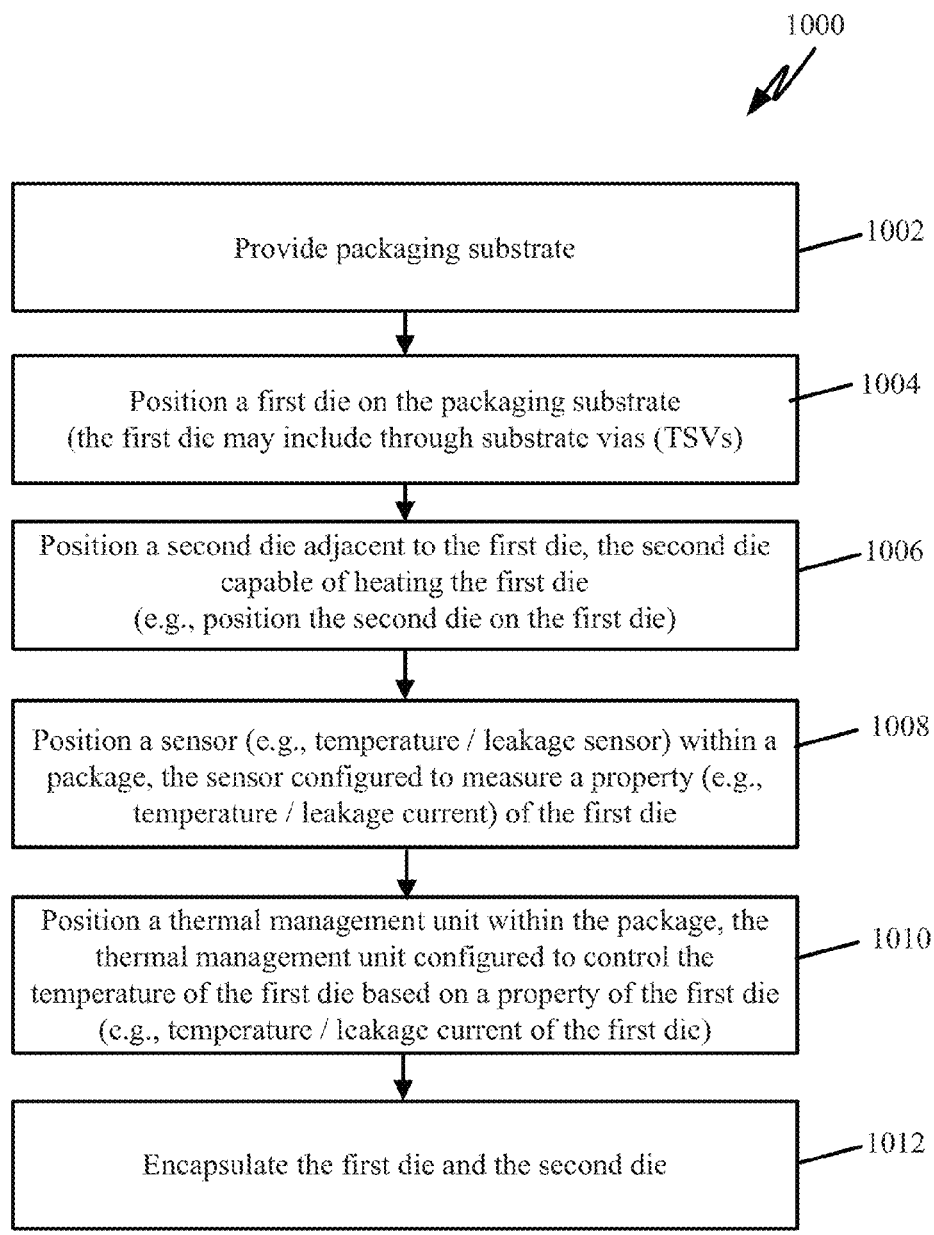

FIG. 10 illustrates a method 1000 for manufacturing a package that includes a central thermal management unit. The method begins by providing (at 1002) a packaging substrate. The packaging substrate may be a semiconductor substrate or a glass substrate. Next, the method positions (at 1004) a first die on the packaging substrate. The first die may include through substrate vias (TSVs). In some implementations, the first die may be a processor or a memory die. The fist die may be coupled to the packaging substrate by through substrate vias (TSVs) of the first die. The first die may also include a central thermal management unit. In such instances, positioning the first die on the packaging substrate also includes positioning the central thermal management unit within the package. The first die may also include a temperature sensor and/or a leakage sensor in some implementations. As such, positioning the first die may also include positioning the temperature sensor and/or leakage sensor in some implementations.

Once the first die has been positioned (at 1004), the method positions (at 1006) a second die adjacent to the first die (e.g., positioning the second die on top of the first die). The second die may be capable of heating the first die. In some implementations, the second die is coupled to the first die by TSVs. The TSVs may be located in the first die and/or the second die. The second die may be a memory die. The second die may include a leakage sensor and/or temperature sensor in some implementations. In such instances, positioning (at 1006) the second die also includes positioning the leakage sensor and/or temperature sensor within the package. The second die may be a processor. The second die may include a central thermal management unit. In such instances, positioning (at 1006) the second, die on the packaging substrate also includes positioning the central thermal management unit within the package.

The method positions (at 1008) a sensor (e.g., temperature/leakage sensor) within a package. In some implementations, the sensor is configured to measure a property (e.g., temperature/leakage current) of the first die.

Different implementations may position the sensor differently in the package. In some implementations, the sensor is positioned adjacent to the first die and/or the second die. The sensor may be part of the first die or the second die. In some implementations, positioning the sensor may include positioning the sensor about (e.g., in or near) the first die or second die before the first die or second die are placed on the packaging substrate. As mentioned above, in some implementations, the sensor may be positioned when the first die or second die is positioned in the package (e.g., at 1004 and/or at 1006).

The method positions (at 1010) a thermal management unit within the package. In some implementations, the thermal management unit is configured to control the temperature of the first die based on a property of the first die (e.g., temperature/leakage current of the first die) by controlling the activity of the first die and/or the second die (e.g., reducing the activity of the first die and/or second die).

Different implementations may position the thermal management unit differently in the package. In some implementations, the thermal management unit is positioned adjacent to the first die and/or the second die. The thermal management unit may be part of the first die or the second die. In some implementations, positioning the thermal management unit may include positioning the thermal management unit about (e.g., in or near) the first die or second die before the first die or second die are placed on the packaging substrate. As mentioned above, in some implementations, the thermal management unit may be positioned when the first die or second die is positioned in the package (e.g., at 1004 and/or at 1006).

After the first die and the second die have been positioned (as well as the sensor and thermal management unit) within the package, the first die and the second die are encapsulated (at 1012) by putting a cap, which creates the package (e.g., System-in-Package (SiP)) and the method ends. Different bonding processes (e.g., thermal compression bonding, reflow bonding) may be used to couple the dice to the substrate. In some implementations, more than two dice are positioned, within the package. In addition, the central thermal management unit may be part of any of the dice or its own die within the package. Moreover, the leakage sensor may be separate from the second die, instead of being integrated within a circuit of the second die.

Exemplary Electronic Devices

FIG. 11 illustrates various electronic devices that may be integrated with any of the aforementioned integrated circuit, die, chip or package. For example, a mobile telephone 1102, a laptop computer 1104, and a fixed location terminal 1106 may include an integrated circuit (IC) 1100 having a central thermal management unit. The IC 1100 may be, for example, any of the integrated circuits, dice or packages described herein. The devices 1102, 1104, 1106 illustrated in FIG. 11 are merely exemplary. Other electronic devices may also feature the IC 1100 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications device, smartphones, tablet computers or any other device that stores or retrieves data or computer instructions, or any combination thereof.

Terms

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first die may be coupled, to a second die in a package even though the first die is never directly physically in contact with the second die.

The terms wafer and substrate may be used herein to include any structure having an exposed surface with which to form an integrated circuit (IC) according to aspects of the present disclosure. The term "die" may be used herein to include an IC. A die may include one or more circuits. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined, to include any material that is less electrically conductive than materials generally referred to as conductors by those skilled in the art. The term "unit" may refer to a component that is part of a die and/or circuit of a die. A unit may be located in one die or a unit may be part of a semiconductor device, system and/or package that is distributed over several dice and/or circuits. Thus, a unit may refer to a component that is physically and/or logically located in several locations.

One or more of the components, steps, features, and/or functions illustrated in FIGS. 2A-2C, 3, 4, 5, 6, 7, 8, 9, 10 and/or 11 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged, and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The terms "machine readable medium" or "machine readable storage medium" include, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits (e.g., processing circuit), elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained, in a single device or distributed, across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would farther appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. For example, the above method is not limited to packages that include dice that are coupled to each other using TSVs, As such, the present teachings can be readily applied to other types of apparatuses and many alternatives, modifications, and variations will be apparent to those skilled in the art.

What is claimed is:

1. A package comprising:
a first die, wherein the first die is an integrated circuit (IC);
a second die adjacent to the first die, the second die capable of heating the first die;
a first plurality of through substrate vias (TSVs) configured to couple the first die to the second die;
a leakage sensor configured to measure a leakage current of the first die; and
a thermal management unit configured to couple to the leakage sensor, the thermal management unit configured to control a temperature of the first die based on the leakage current of the first die.

2. The package of claim 1, wherein the thermal management unit is configured to control the temperature of the first die by controlling heat emanating from the second die based on the leakage current of the first die.

3. The package of claim 2, wherein controlling the heat emanating from the second die comprises reducing activity of the second die based on the leakage current of the first die.

4. The package of claim 1, wherein the leakage sensor is configured to measure a voltage drop in the first die.

5. The package of claim 1, wherein the first die has a thermal tolerance, the thermal management unit is configured to control the temperature of the first die by controlling heat emanating from the second die based on the thermal tolerance of the first die.

6. The package of claim 5, wherein controlling the heat emanating from the second die based on the thermal tolerance of the first die comprises determining the temperature of the first die based on the measured leakage current of the first die and comparing the measured temperature to the thermal tolerance of the first die.

7. The package of claim 1 further comprising a heat reducing mechanism configured to couple to the thermal management unit.

8. The package of claim 7, wherein the first die is a memory and the heat reducing mechanism is a memory controller.

9. The package of claim 7, wherein the heat reducing mechanism reduces heat by performing one of at least Dynamic Voltage and Frequency Scaling (DVFS), Dynamic Frequency Scaling (DFS), clock gating, and power collapsing.

10. The package of claim 1, wherein the leakage sensor is separate from the first die.

11. The package of claim 1, wherein the leakage sensor is part of the first die.

12. The package of claim 1, wherein the thermal management unit is part of the second die.

13. The package of claim 1, wherein the first die is stacked on top of the second die.

14. The package of claim 1, further comprising a substrate and a second plurality of through substrate vias (TSVs), wherein one of the first die and the second die is configured to couple to the substrate by the second plurality of through substrate vias (TSVs).

15. The package of claim 1, wherein the first die, the second die and the thermal management unit are part of at least one of a System in Package (SiP) and System on Glass (SoG).

16. The package of claim 1, wherein the package is incorporated into at least one of a music player, a video player, an entertainment unit, a navigation device, a communications device, a mobile phone, a smartphone, a personal digital assistant, a fixed location terminal, a tablet computer, and/or a laptop computer.

17. An apparatus comprising:
a first die, wherein the first die is an integrated circuit (IC);
a second die adjacent to the first die, the second die capable of heating the first die;
a first plurality of through substrate vias (TSVs) configured to couple the first die to the second die;
means for measuring a leakage current of the first die; and
means for controlling a temperature of the first die based on the leakage current of the first die.

18. The apparatus of claim 17, wherein the means for controlling the temperature of the first die is a means for controlling heat emanating from the second die based on the leakage current of the first die.

19. The apparatus of claim 18, wherein means for controlling the heat emanating from the second die comprises a means for reducing activity of the second die based on the leakage current of the first die.

20. The apparatus of claim 17, wherein the means for measuring the leakage current is a means for measuring a voltage drop in the first die.

21. The apparatus of claim 17, wherein the first die has a thermal tolerance, the means for controlling the temperature of the first die comprises a means for controlling heat emanating from the second die based on the thermal tolerance of the first die.

22. The apparatus of claim 21, wherein the means for controlling the heat emanating from the second die based on the thermal tolerance of the first die comprises means for determining the temperature of the first die based on the measured leakage current of the first die and means for comparing the measured temperature to the thermal tolerance of the first die.

23. The apparatus of claim 17 further comprising a means for a heat reducing mechanism.

24. The apparatus of claim 23, wherein the first die is a memory and the means for the heat reducing mechanism is a memory controller; and further comprising a substrate and a second plurality of through substrate vias (TSVs) configured to couple the substrate to one of the first die or the second die.

25. The apparatus of claim 23, wherein the means for the heat reducing mechanism reduces heat by performing one of at least Dynamic Voltage and Frequency Scaling (DVFS), Dynamic Frequency Scaling (DFS), clock gating, and power collapsing.

26. The apparatus of claim 17, wherein the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

27. A method for manufacturing a package encapsulating several dice, the method comprising:
    positioning a first die on a packaging substrate, wherein the first die is an integrated circuit (IC);
    positioning a second die adjacent to the first die, the second die capable of heating the first die;
    positioning a first plurality of through substrate vias (TSVs) between the first die and the second die, wherein the first plurality of TSVs is configured to couple the first die to the second die;
    positioning a leakage sensor within the package, the leakage sensor configured to measure a leakage current of the first die; and
    positioning a thermal management unit within the package, the thermal management unit configured to couple to the leakage sensor, the thermal management unit configured to control a temperature of the first die based on the leakage current of the first die.

28. The method of claim 27, wherein the thermal management unit is configured to control the temperature of the first die by controlling heat emanating from the second die based on the leakage current of the first die.

29. The method of claim 28, wherein controlling the heat emanating from the second die comprises reducing activity of the second die based on the leakage current of the first die.

30. The method of claim 27, wherein the leakage sensor is configured to measure a voltage drop in the first die.

31. The method of claim 27, wherein the first die has a thermal tolerance, the thermal management unit is configured to control the temperature of the first die by controlling heat emanating from the second die based on the thermal tolerance of the first die.

32. The method of claim 31, wherein controlling the heat emanating from the second die based on the thermal tolerance of the first die comprises determining the temperature of the first die based on the measured leakage current of the first die and comparing the measured temperature to the thermal tolerance of the first die.

33. The method of claim 27 further comprising:
    positioning a heat reducing mechanism within the package, the heat reducing mechanism configured to couple to the thermal management unit; and
    positioning a second plurality of through substrate vias (TSVs) between the first die and the packaging substrate, wherein the second plurality of TSVs is configured to couple the first die to the packaging substrate.

34. The method of claim 33, wherein the first die is a memory and the heat reducing mechanism is a memory controller.

35. The method of claim 33, wherein the heat reducing mechanism reduces heat by performing one of at least Dynamic Voltage and Frequency Scaling (DVFS), Dynamic Frequency Scaling (DFS), clock gating, and power collapsing.

36. The method of claim 27, wherein the package is incorporated into at least one of a music player, a video player, an entertainment unit, a navigation device, a communications device, a mobile phone, a smartphone, a personal digital assistant, a fixed location terminal, a tablet computer, and/or a laptop computer.

37. A package comprising:
    a first die on a substrate, wherein the first die is an integrated circuit (IC);
    a second die configured to couple to the first die through a plurality of through substrate vias (TSVs), the second die capable of heating the first die via the plurality of TSVs;
    a leakage sensor configured to measure a leakage current of the first die; and
    a thermal management unit configured to couple to the leakage sensor, the thermal management unit configured to control a temperature of the first die based on the leakage current of the first die.

38. The package of claim 37, wherein the thermal management unit is configured to control the temperature of the first die by controlling heat emanating from the second die based on the leakage current of the first die.

39. The package of claim 37, wherein the first die, the second die and the thermal management unit are part of at least one of a System in Package (SiP) and System on Glass (SoG).

40. The package of claim 37, wherein the package is incorporated into at least one of a music player, a video player, an entertainment unit, a navigation device, a communications device, a mobile phone, a smartphone, a personal digital assistant, a fixed location terminal, a tablet computer, and/or a laptop computer.

41. A method for manufacturing a package, the method comprising:
    positioning a first die on a packaging substrate, wherein the first die is an integrated circuit (IC);
    positioning a second die adjacent to the first die,
    positioning a plurality of through substrate vias (TSVs) between the first die and the second die, the plurality of TSVs configured to couple the first die to the second die, wherein the second die is capable of heating the first die via the plurality of TSVs;

positioning a leakage sensor within the package, the leakage sensor configured to measure a leakage current of the first die;

positioning a thermal management unit within the package, the thermal management unit configured to couple to the leakage sensor, the thermal management unit configured to control a temperature of the first die based on the leakage current of the first die; and positioning a second plurality of through substrate vias (TSVs) between the first die and the packaging substrate, wherein the second plurality of TSVs is configured to couple the first die to the packaging substrate.

42. A method for managing temperature in a package comprising a first die, a second die, a first plurality of through substrate vias (TSVs), and a second plurality of through substrate vias (TSVs), wherein the first plurality of TSVs is configured to couple the first die to a package substrate, comprising:

using a leakage sensor within the package for measuring a leakage current of a first die, the first die configured to couple to the second die via the second plurality of through substrate vias (TSVs), wherein the first die is an integrated circuit (IC); and controlling the temperature of the first die by reducing activity of the second die based on the measured leakage current of the first die.

43. The method of claim 42, wherein the first die being a memory die.

44. A non-transitory computer readable storage medium comprising one or more instructions for managing temperature in a package comprising a first die and a second die, and a plurality of through substrate vias (TSVs), which when executed by at least one processor, causes the at least one processor to:

measure a leakage current of a first die, the first die configured to couple to the second die via the plurality of through substrate vias (TSVs), wherein the first die is an integrated circuit (IC); and control the temperature of the first die by reducing activity of the second die based on the measured leakage current of the first die.

45. The non-transitory computer readable storage medium of claim 44, wherein the first die being a memory die.

46. A method for managing temperature in a package comprising a first die and a second die, and a plurality of through substrate vias (TSVs) configured to couple the first die to the second die, comprising:

using a leakage sensor within the package for measuring a leakage current of a first die, wherein the first die is an integrated circuit (IC); and controlling the temperature of the first die by reducing activity of the second die based on the leakage current of the first die.

47. The method of claim 46, wherein measuring the leakage current of the first die comprises measuring a voltage drop across the first die.

48. The method of claim 46, wherein reducing the activity of the second die reduces heat emanating from the second die.

49. A non-transitory computer readable storage medium comprising one or more instructions for managing temperature in a package comprising a first die and a second die, and a plurality of through substrate vias (TSVs) configured to couple the first die to the second die, which when executed by at least one processor, causes the at least one processor to:

use a leakage sensor within the package to measure a leakage current of a first die, wherein the first die is an integrated circuit (IC); and control the temperature of the first die by reducing activity of the second die based on the leakage current of the first die.

50. The non-transitory computer readable storage medium of claim 49, wherein the one or more instructions, which when executed by at least one processor, causes the at least one processor to measure the leakage current of the first die comprises one or more instructions, which when executed by at least one process, causes the at least one processor to measure a voltage drop across the first die.

51. The non-transitory computer readable storage medium of claim 49, wherein the one or more instructions, which when executed by at least one processor, causes the at least one processor to reduce the activity of the second die comprises one or more instructions, which when executed by at least one process, causes the at least one processor to reduces heat emanating from the second die.

* * * * *